(12) United States Patent
Baum et al.

(10) Patent No.: US 10,387,298 B2
(45) Date of Patent: Aug. 20, 2019

(54) ARTIFICIAL NEURAL NETWORK INCORPORATING EMPHASIS AND FOCUS TECHNIQUES

(71) Applicant: Hailo Technologies Ltd., Ra'anana (IL)

(72) Inventors: Avi Baum, Givat Shmuel (IL); Or Danon, Kiryat Ono (IL); Mark Grobman, Tel Aviv (IL); Hadar Zeitlin, Kfar Saba (IL)

(73) Assignee: Hailo Technologies Ltd (IL)

( * ) Notice: Subject to any disclaimer, the term of this patent is extended or adjusted under 35 U.S.C. 154(b) by 129 days.

(21) Appl. No.: 15/669,933

(22) Filed: Aug. 6, 2017

(65) Prior Publication Data
US 2018/0285678 A1 Oct. 4, 2018

Related U.S. Application Data
(60) Provisional application No. 62/531,372, filed on Dec. 7, 2017, provisional application No. 62/481,492, filed on Apr. 4, 2017.

(51) Int. Cl.
*G06F 12/02* (2006.01)
*G06N 3/063* (2006.01)
(Continued)

(52) U.S. Cl.
CPC ............ *G06F 12/0207* (2013.01); *G06F 5/01* (2013.01); *G06F 7/501* (2013.01); *G06F 7/523* (2013.01);
(Continued)

(58) Field of Classification Search
CPC ............ G06F 12/0207; G06F 12/0646; G06F 12/0692; G06F 13/1663; G06F 17/10;
(Continued)

(56) References Cited

U.S. PATENT DOCUMENTS

| 662,908 A | 12/1900 | Boucher |
| 960,721 A | 6/1910 | Sheppard |

(Continued)

FOREIGN PATENT DOCUMENTS

| CA | 2019099 A1 | 12/1990 |
| CA | 2002681 A1 | 5/1991 |

(Continued)

OTHER PUBLICATIONS

ISR/WO dated Jun. 24, 2018; issued in connection with PCT/IL2018/050392.

(Continued)

*Primary Examiner* — Edward Park
(74) *Attorney, Agent, or Firm* — Zaretsky Group PC; Howard Zaretsky

(57) ABSTRACT

A novel and useful artificial neural network that incorporates emphasis and focus techniques to extract more information from one or more portions of an input image compared to the rest of the image. The ANN recognizes that valuable information in an input image is typically not distributed throughout the image but rather is concentrated in one or more regions. Rather than implement CNN layers sequentially (i.e. row by row) on the input domain of each layer, the present invention leverages the fact that valuable information is focused in one or more regions of the image where it is desirable to apply more attention and for which it is desired to apply more elaborate evaluation. Precision dilution can be applied to those portions of the input image that are not the center of focus and emphasis. A spatial aware function determines the location(s) of the ears of focus and is applied to the first convolutional layer. Dilution of precision is performed either before and/or after the first convolutional layer thereby significantly reducing computation and power requirements.

19 Claims, 11 Drawing Sheets

(51) Int. Cl.

| | | |
|---|---|---|
| *G06F 12/06* | (2006.01) | |
| *G06F 7/501* | (2006.01) | |
| *G06F 7/523* | (2006.01) | |
| *G06F 9/50* | (2006.01) | |
| *G06N 3/04* | (2006.01) | |
| *G06F 17/10* | (2006.01) | |
| *G06F 5/01* | (2006.01) | |
| *G06N 3/08* | (2006.01) | |
| *G06F 13/16* | (2006.01) | |
| *G06F 9/30* | (2018.01) | |
| *G06K 9/46* | (2006.01) | |
| *G06K 9/62* | (2006.01) | |
| *G06N 3/02* | (2006.01) | |

(52) U.S. Cl.
CPC ........ *G06F 9/30054* (2013.01); *G06F 9/5016* (2013.01); *G06F 9/5027* (2013.01); *G06F 12/0646* (2013.01); *G06F 12/0692* (2013.01); *G06F 13/1663* (2013.01); *G06F 17/10* (2013.01); *G06K 9/46* (2013.01); *G06K 9/62* (2013.01); *G06N 3/02* (2013.01); *G06N 3/04* (2013.01); *G06N 3/0454* (2013.01); *G06N 3/063* (2013.01); *G06N 3/08* (2013.01); *G06N 3/084* (2013.01); *G06N 3/082* (2013.01); *Y02D 10/14* (2018.01)

(58) Field of Classification Search
CPC . G06F 5/01; G06F 7/501; G06F 7/523; G06F 9/30054; G06F 9/5016; G06F 9/5027; G06K 9/62; G06N 3/02; G06N 3/04; G06N 3/0454; G06N 3/063; G06N 3/08; G06N 3/084; G06N 3/082; Y02D 10/14
See application file for complete search history.

(56) References Cited

U.S. PATENT DOCUMENTS

| | | | |
|---|---|---|---|
| 4,450,533 A | 5/1984 | Petit | |
| 4,943,931 A | 7/1990 | Allen | |
| 4,979,124 A | 12/1990 | Sachse et al. | |
| 4,994,982 A | 2/1991 | Duranton et al. | |
| 5,003,490 A | 3/1991 | Castelaz et al. | |
| 5,008,833 A | 4/1991 | Agranat et al. | |
| 5,056,037 A | 10/1991 | Eberhardt | |
| 5,080,464 A | 1/1992 | Toyoda | |
| 5,091,864 A | 2/1992 | Baji et al. | |
| 5,148,515 A | 9/1992 | Vassiliadis et al. | |
| 5,195,169 A | 3/1993 | Kamiya et al. | |
| 5,195,170 A | 3/1993 | Eberhardt | |
| 5,274,743 A | 12/1993 | Imondi et al. | |
| 5,278,945 A | 1/1994 | Basehore et al. | |
| 5,293,456 A | 3/1994 | Guez et al. | |
| 5,293,459 A | 3/1994 | Duranton et al. | |
| 5,297,232 A | 3/1994 | Murphy | |
| 5,365,460 A | 11/1994 | Chung | |
| 5,367,612 A | 11/1994 | Bozich et al. | |
| 5,423,001 A | 6/1995 | Ueda | |
| 5,430,830 A | 7/1995 | Frank et al. | |
| 5,444,822 A | 8/1995 | Shinohara | |
| 5,448,681 A | 9/1995 | Khan | |
| 5,450,315 A | 9/1995 | Stefanski | |
| 5,465,204 A | 11/1995 | Sekine et al. | |
| 5,479,579 A | 12/1995 | Duong et al. | |
| 5,485,545 A | 1/1996 | Kojima et al. | |
| 5,486,996 A | 1/1996 | Samad et al. | |
| 5,493,631 A | 2/1996 | Huang et al. | |
| 5,504,839 A | 4/1996 | Mobus | |
| 5,519,811 A | 5/1996 | Yoneda et al. | |
| 5,521,985 A | 5/1996 | Camp, Jr. et al. | |
| 5,533,383 A | 7/1996 | Greene et al. | |
| 5,537,513 A | 7/1996 | DeVille | |
| 5,583,771 A | 12/1996 | Lynch et al. | |
| 5,615,305 A | 3/1997 | Nunally | |
| 5,627,943 A | 5/1997 | Yoneda et al. | |
| 5,689,622 A | 11/1997 | Higashino et al. | |
| 5,704,016 A | 12/1997 | Shigematsu et al. | |
| 5,705,956 A | 1/1998 | Neely | |
| 5,717,832 A | 2/1998 | Steimle et al. | |
| 5,740,325 A | 4/1998 | Wang | |
| 5,745,652 A | 4/1998 | Bigus | |
| 5,748,849 A | 5/1998 | Gobert | |
| 5,796,925 A | 8/1998 | Deville | |
| 5,956,703 A | 9/1999 | Turner et al. | |
| 5,978,782 A | 11/1999 | Neely | |
| 6,267,298 B1 | 7/2001 | Campbell | |
| 6,317,658 B1 | 11/2001 | Vian | |
| 6,366,236 B1 | 4/2002 | Farmer et al. | |
| 6,434,541 B1 | 8/2002 | Tawel et al. | |
| 6,493,689 B2 | 12/2002 | Kotoulas et al. | |
| 6,523,018 B1 | 2/2003 | Louis et al. | |
| 6,529,614 B1 | 3/2003 | Chao et al. | |
| 6,539,368 B1 | 3/2003 | Chernikov et al. | |
| 6,578,020 B1 | 6/2003 | Nguyen | |
| 6,622,125 B1 | 9/2003 | Cragun et al. | |
| 6,751,529 B1 | 6/2004 | Fouche | |
| 6,836,767 B2 | 12/2004 | McBride | |
| 6,882,992 B1 | 4/2005 | Werbos | |
| 7,069,256 B1 | 6/2006 | Campos | |
| 7,082,419 B1 | 7/2006 | Lightowler | |
| 7,113,970 B2 | 9/2006 | Chiueh | |
| 7,117,045 B2 | 10/2006 | Hittle et al. | |
| 7,174,325 B1 | 2/2007 | Ascoli | |
| 7,308,322 B1 | 12/2007 | Discenzo et al. | |
| 7,647,284 B2 | 1/2010 | Prokhorov | |
| 8,081,816 B1 | 12/2011 | Irick et al. | |
| 8,126,828 B2 | 2/2012 | Snook et al. | |
| 8,131,659 B2 | 3/2012 | Xu et al. | |
| 8,326,782 B2 | 12/2012 | Snook et al. | |
| 8,391,306 B2 | 3/2013 | Ito et al. | |
| 8,892,485 B2 | 11/2014 | Aparin et al. | |
| 9,077,491 B2 | 7/2015 | Mar et al. | |
| 9,129,220 B2 | 9/2015 | Aparin et al. | |
| 9,129,222 B2 | 9/2015 | Aparin | |
| 9,153,230 B2 | 10/2015 | Maaninen | |
| 9,159,020 B2 | 10/2015 | Alcarez-Icaza Rivera et al. | |
| 9,195,656 B2 | 11/2015 | Fructuoso et al. | |
| 9,306,965 B1 | 4/2016 | Grossman et al. | |
| 9,400,954 B2 | 7/2016 | Modha | |
| 9,466,022 B2 | 10/2016 | Alvarez-Icaza Rivera et al. | |
| 9,477,925 B2 | 10/2016 | Seide et al. | |
| 9,530,092 B2 | 12/2016 | Chatterjee et al. | |
| 9,542,643 B2 | 1/2017 | Levin et al. | |
| 9,558,444 B2 | 1/2017 | Palmer et al. | |
| 2003/0069516 A1 | 4/2003 | Becker et al. | |
| 2004/0167418 A1 | 8/2004 | Nguyen et al. | |
| 2005/0256420 A1 | 11/2005 | Noman et al. | |
| 2006/0015703 A1 | 1/2006 | Ramchandran | |
| 2006/0085558 A1 | 4/2006 | Solomon | |
| 2008/0117220 A1 | 5/2008 | Gorchetchnikov et al. | |
| 2010/0100514 A1 | 4/2010 | Raymond et al. | |
| 2013/0079842 A1 | 3/2013 | Mokelke et al. | |
| 2014/0032457 A1 | 1/2014 | Palmer et al. | |
| 2014/0156576 A1 | 6/2014 | Nugent | |
| 2014/0344203 A1 | 11/2014 | Ahn | |
| 2015/0026104 A1 | 1/2015 | Tambos | |
| 2015/0134580 A1 | 5/2015 | Wilson | |
| 2015/0170021 A1 | 6/2015 | Lupon et al. | |
| 2015/0212861 A1 | 7/2015 | Canoy et al. | |
| 2015/0269480 A1 | 9/2015 | Levin et al. | |
| 2015/0324691 A1 | 11/2015 | Dropps et al. | |
| 2015/0324692 A1 | 11/2015 | Ritchey et al. | |
| 2016/0232442 A1 | 8/2016 | Fan et al. | |
| 2016/0275398 A1 | 9/2016 | Corvinelli et al. | |
| 2016/0335119 A1 | 11/2016 | Merill et al. | |
| 2016/0335534 A1 | 11/2016 | Nere et al. | |
| 2017/0011288 A1 | 1/2017 | Brothers et al. | |
| 2017/0024644 A1 | 1/2017 | Van Der Made et al. | |
| 2017/0103313 A1 | 4/2017 | Ross et al. | |
| 2017/0110093 A1* | 4/2017 | Stein | G09G 5/30 |
| 2017/0206437 A1* | 7/2017 | Hachiya | G06K 9/6257 |
| 2018/0189231 A1 | 7/2018 | Fleming | |

(56) References Cited

U.S. PATENT DOCUMENTS

FOREIGN PATENT DOCUMENTS

| | | |
|---|---|---|
| CA | 2383318 A1 | 10/2003 |
| CA | 2927171 A1 | 7/2016 |
| CN | 101452258 | 6/2009 |
| CN | 101493677 | 7/2009 |
| CN | 201927073 | 8/2011 |
| CN | 101882238 | 2/2012 |
| CN | 102490120 | 6/2012 |
| CN | 104107507 | 10/2014 |
| CN | 104459064 | 3/2015 |
| CN | 104493826 | 4/2015 |
| CN | 104899641 | 9/2015 |
| CN | 105184366 | 12/2015 |
| CN | 105260776 | 1/2016 |
| CN | 105311750 | 2/2016 |
| CN | 105653790 | 6/2016 |
| CN | 105676649 | 6/2016 |
| CN | 105678379 | 6/2016 |
| CN | 105844330 | 8/2016 |
| CN | 105930902 | 9/2016 |
| CN | 106022468 | 10/2016 |
| CN | 106355246 | 1/2017 |
| CN | 106447034 | 2/2017 |
| CN | 106503796 | 3/2017 |
| CN | 106529670 | 3/2017 |
| DE | 4310279 A1 | 10/1993 |
| DE | 19718224 A1 | 11/1997 |
| EP | 388806 A2 | 9/1990 |
| EP | 575716 A1 | 12/1993 |
| EP | 411761 B1 | 4/1996 |
| EP | 370543 B1 | 1/1997 |
| EP | 568146 B1 | 11/1997 |
| EP | 465241 B1 | 11/1998 |
| EP | 525543 B1 | 1/1999 |
| EP | 2825974 A1 | 1/2015 |
| EP | 3035249 | 6/2016 |
| FR | 2724029 B1 | 12/1997 |
| FR | 2780919 B1 | 5/2002 |
| GB | 2245401 | 1/1992 |
| GB | 2351885 | 1/2001 |
| JP | 2157832 | 6/1990 |
| JP | 2206867 | 8/1990 |
| JP | 2207369 | 8/1990 |
| JP | 2267660 | 11/1990 |
| JP | 2292602 | 12/1990 |
| JP | 3100857 | 4/1991 |
| JP | 3276137 | 12/1991 |
| JP | 4040581 | 2/1992 |
| JP | 4113481 | 4/1992 |
| JP | 4148212 | 5/1992 |
| JP | 4182769 | 6/1992 |
| JP | 4237388 | 8/1992 |
| JP | 4264664 | 9/1992 |
| JP | 4328691 | 11/1992 |
| JP | 4336370 | 11/1992 |
| JP | 4344970 | 12/1992 |
| JP | 5020294 | 1/1993 |
| JP | 5067064 | 3/1993 |
| JP | 5081227 | 4/1993 |
| JP | 5128284 | 5/1993 |
| JP | 5128285 | 5/1993 |
| JP | 5159087 | 6/1993 |
| JP | 5165800 | 7/1993 |
| JP | 5165987 | 7/1993 |
| JP | 5181547 | 7/1993 |
| JP | 5197701 | 8/1993 |
| JP | 5282272 | 10/1993 |
| JP | 5334278 | 12/1993 |
| JP | 5346914 | 12/1993 |
| JP | 6019868 | 1/1994 |
| JP | 6076092 | 3/1994 |
| JP | 6161586 | 6/1994 |
| JP | 7005904 | 1/1995 |
| JP | 7105165 | 4/1995 |
| JP | 7160796 | 6/1995 |
| JP | 7302292 | 11/1995 |
| JP | 8161282 | 6/1996 |
| JP | 9026948 | 1/1997 |
| JP | 2000322400 | 11/2000 |
| JP | 03177996 B2 | 6/2001 |
| JP | 2006154992 | 6/2006 |
| JP | 2016153984 | 8/2016 |
| KR | 2001095960 | 11/2001 |
| KR | 367715 B1 | 1/2003 |
| KR | 2005042871 | 5/2005 |
| KR | 919572 B1 | 10/2009 |
| RU | 2057363 C1 | 3/1996 |
| RU | 2473126 C1 | 1/2013 |
| RU | 2602973 C1 | 11/2016 |
| UA | 96148 C2 | 10/2011 |
| WO | WO 1991019267 A1 | 12/1991 |
| WO | WO 1993/023814 A1 | 11/1993 |
| WO | WO 1996041277 A1 | 12/1996 |
| WO | WO 2005/051189 A2 | 6/2005 |
| WO | WO 2007/033101 A2 | 3/2007 |
| WO | WO 2012/006468 A1 | 1/2012 |
| WO | WO 2015/157013 A1 | 10/2015 |
| WO | WO 2015/193531 A1 | 12/2015 |
| WO | WO 2016/099779 A1 | 6/2016 |
| WO | WO 2016/186811 A1 | 11/2016 |

OTHER PUBLICATIONS

ISR/WO dated Jul. 10, 2018; issued in connection with PCT/IL2018/050393.
ISR/WO dated Jul. 12, 2018; issued in connection with PCT/IL2018/050394.
ISR/WO dated Jul. 11, 2018; issued in connection with PCT/IL2018/050395.
ISR/WO dated Jul. 15, 2018; issued in connection with PCT/IL2018/050396.
Zhu et al., "Flow-Guided Feature Aggregation for Video Object Detection", Arxiv Technology Report, arXiv:1703.10025v2 [cs.CV], Aug. 2017.

\* cited by examiner

ARTIFICIAL NEURAL NETWORK INCORPORATING EMPHASIS AND FOCUS TECHNIQUES

REFERENCE TO PRIORITY APPLICATIONS

This application claims the benefit of U.S. Provisional Application No. 62/481,492, filed Apr. 4, 2017, entitled "Multi-Layer Artificial Neural Network Computation Engine and Microarchitecture," and U.S. Provisional Application No. 62/531,372, filed Jul. 12, 2017, entitled "Multi-Layer Artificial Neural Network Computation Engine and Microarchitecture," both of which are incorporated herein by reference in their entirety.

FIELD OF THE DISCLOSURE

The subject matter disclosed herein relates to the field of neural networks and more particularly relates to an artificial neural network that incorporates emphasis and focus techniques to extract more information from one or more portions of an input image.

BACKGROUND OF THE INVENTION

Artificial neural networks (ANNs) are computing systems inspired by the biological neural networks that constitute animal brains. Such systems learn, i.e. progressively improve performance, to do tasks by considering examples, generally without task-specific programming. For example, in image recognition, they might learn to identify images that contain cats by analyzing example images that have been manually labeled as "cat" or "no cat" and using the analytic results to identify cats in other images. They have found most use in applications difficult to express in a traditional computer algorithm using rule-based programming.

An ANN is based on a collection of connected units called artificial neurons, analogous to axons in a biological brain. Each connection or synapse between neurons can transmit a signal to another neuron. The receiving or postsynaptic neuron can process the signals and then signal downstream neurons connected to it. Neurons may have state, generally represented by real numbers, typically between 0 and 1. Neurons and synapses may also have a weight that varies as learning proceeds, which can increase or decrease the strength of the signal that it sends downstream. Further, they may have a threshold such that only if the aggregate signal is below or above that level is the downstream signal sent.

Typically, neurons are organized in layers. Different layers may perform different kinds of transformations on their inputs. Signals travel from the first, i.e. input, to the last, i.e. output, layer, possibly after traversing the layers multiple times.

The original goal of the neural network approach was to solve problems in the same way that a human brain would. Over time, attention focused on matching specific mental abilities, leading to deviations from biology such as backpropagation, or passing information in the reverse direction and adjusting the network to reflect that information.

The components of an artificial neural network include (1) neurons having an activation threshold; (2) connections and weights for transferring the output of a neuron; (3) a propagation function to compute the input to a neuron from the output of predecessor neurons; and (4) a learning rule which is an algorithm that modifies the parameters of the neural network in order for a given input to produce a desired outcome which typically amounts to modifying the weights and thresholds.

Given a specific task to solve, and a class of functions F, learning entails using a set of observations to find the function that which solves the task in some optimal sense. A cost function C is defined such that, for the optimal solution no other solution has a cost less than the cost of the optimal solution).

The cost function C is a measure of how far away a particular solution is from an optimal solution to the problem to be solved. Learning algorithms search through the solution space to find a function that has the smallest possible cost.

A neural network can be trained using backpropagation which is a method to calculate the gradient of the loss function with respect to the weights in an ANN.

The weight updates of backpropagation can be done via well-known stochastic gradient descent techniques. Note that the choice of the cost function depends on factors such as the learning type (e.g., supervised, unsupervised, reinforcement) and the activation function.

There are three major learning paradigms and each corresponds to a particular learning task: supervised learning, unsupervised learning, and reinforcement learning.

Supervised learning uses a set of example pairs and the goal is to find a function in the allowed class of functions that matches the examples. A commonly used cost is the mean-squared error, which tries to minimize the average squared error between the network's output and the target value over all example pairs. Minimizing this cost using gradient descent for the class of neural networks called multilayer perceptrons (MLP), produces the backpropagation algorithm for training neural networks. Examples of supervised learning include pattern recognition, i.e. classification, and regression, i.e. function approximation.

In unsupervised learning, some data is given and the cost function to be minimized, that can be any function of the data and the network's output. The cost function is dependent on the task (i.e. the model domain) and any a priori assumptions (i.e. the implicit properties of the model, its parameters, and the observed variables). Tasks that fall within the paradigm of unsupervised learning are in general estimation problems; the applications include clustering, the estimation of statistical distributions, compression, and filtering.

In reinforcement learning, data is usually not provided, but generated by an agent's interactions with the environment. At each point in time, the agent performs an action and the environment generates an observation and an instantaneous cost according to some typically unknown dynamics. The aim is to discover a policy for selecting actions that minimizes some measure of a long-term cost, e.g., the expected cumulative cost. The environment's dynamics and the long-term cost for each policy are usually unknown, but can be estimated.

A multilayer perceptron (MLP) is a class of feedforward artificial neural network. An MLP consists of at least three layers of nodes. Except for the input nodes, each node is a neuron that uses a nonlinear activation function. MLP utilizes a supervised learning technique called backpropagation for training. Its multiple layers and non-linear activation distinguish MLP from a linear perceptron. It can distinguish data that is not linearly separable.

In machine learning, a convolutional neural network (CNN) is a class of deep, feedforward artificial neural network that has successfully been applied to analyzing visual imagery. CNNs use a variation of multilayer perceptrons designed to require minimal preprocessing. Convolutional networks were inspired by biological processes in which the connectivity pattern between neurons is inspired by the organization of the animal visual cortex. Individual cortical neurons respond to stimuli only in a restricted region of the visual field known as the receptive field. The receptive fields of different neurons partially overlap such that they cover the entire visual field.

CNNs use relatively little pre-processing compared to other image classification algorithms. This means that the network learns the filters that in traditional algorithms were hand-engineered. This independence from prior knowledge and human effort in feature design is a major advantage. CNNs have applications in image and video recognition, recommender systems and natural language processing. A CNN consists of an input and an output layer, as well as multiple hidden layers. The hidden layers are either convolutional, pooling or fully connected.

Convolutional layers apply a convolution operation to the input, passing the result to the next layer. The convolution approximates the response of an individual neuron to visual stimuli. Each convolutional neuron processes data only for its receptive field. Tiling allows CNNs to tolerate translation of the input image. The convolution operation reduces the number of free parameters and improves generalization.

Convolutional networks may include local or global pooling layers, which combine the outputs of neuron clusters at one layer into a single neuron in the next layer. For example, max pooling uses the maximum value from each of a cluster of neurons at the prior layer. This is in contrast to fully connected layers which connect every neuron in one layer to every neuron in another layer.

A feature of CNNs is that they share weights in convolutional layers, which means that the same filter (i.e. weight bank) is used for each receptive field in the layer; this reduces memory requirements and improves performance.

While traditional multilayer perceptron (MLP) models are successfully used for image recognition, due to the full connectivity between nodes, they suffer from the curse of dimensionality and thus do not scale well to higher resolution images. In addition, such network architecture does not take into account the spatial structure of data, treating input pixels which are far apart the same as pixels that are close together. Thus, full connectivity of neurons is wasteful for the purpose of image recognition.

Convolutional neural networks are biologically inspired variants of multilayer perceptrons, designed to emulate the behavior of a visual cortex. These models mitigate the challenges posed by the MLP architecture by exploiting the strong spatially local correlation present in natural images. As opposed to MLPs, CNNs have the following distinguishing features:

1. 3D volumes of neurons: The layers of a CNN have neurons arranged in three dimensions: width, height and depth. The neurons inside a layer are connected to only a small region of the layer before it, called a receptive field. Distinct types of layers, both locally and completely connected, are stacked to form a CNN architecture.
2. Local connectivity: Following the concept of receptive fields, CNNs exploit spatial locality by enforcing a local connectivity pattern between neurons of adjacent layers. The architecture thus ensures that the learnt "filters" produce the strongest response to a spatially local input pattern. Stacking many such layers leads to non-linear "filters" that become increasingly "global" (i.e. responsive to a larger region of pixel space). This allows the network to first create representations of small parts of the input, then from them assemble representations of larger areas.
3. Shared weights: In CNNs, each filter is replicated across the entire visual field. These replicated units share the same parameterization (weight vector and bias) and form a feature map. This means that all the neurons in a given convolutional layer respond to the same feature (within their specific response field). Replicating units in this way allows for features to be detected regardless of their position in the visual field, thus constituting the property of translation invariance.

Together, these properties allow CNNs to achieve better generalization on vision problems. Weight sharing dramatically reduces the number of free parameters learned, thus lowering the memory requirements for running the network. Decreasing the memory footprint allows the training of larger, more powerful networks.

A CNN architecture is formed by a stack of distinct layers that transform the input volume into an output volume through a differentiable function.

The convolutional layer is the core building block of a CNN. The layer's parameters consist of a set of learnable filters (or kernels), which have a small receptive field, but extend through the full depth of the input volume. During the forward pass, each filter is convolved across the width and height of the input volume, computing the dot product between the entries of the filter and the input and producing a two-dimensional activation map of that filter. As a result, the network learns filters that activate when it detects some specific type of feature at some spatial position in the input.

Stacking the activation maps for all filters along the depth dimension forms the full output volume of the convolution layer. Every entry in the output volume can thus also be interpreted as an output of a neuron that looks at a small region in the input and shares parameters with neurons in the same activation map.

When dealing with high-dimensional inputs such as images, it is impractical to connect neurons to all neurons in the previous volume because such a network architecture does not take the spatial structure of the data into account. Convolutional networks exploit spatially local correlation by enforcing a local connectivity pattern between neurons of adjacent layers: each neuron is connected to only a small region of the input volume. The extent of this connectivity is a hyperparameter called the receptive field of the neuron. The connections are local in space (along width and height), but always extend along the entire depth of the input volume. Such an architecture ensures that the learnt filters produce the strongest response to a spatially local input pattern.

Three hyperparameters control the size of the output volume of the convolutional layer: the depth, stride and zero-padding.

1. The depth of the output volume controls the number of neurons in a layer that connect to the same region of the input volume. These neurons learn to activate for different features in the input. For example, if the first convolutional layer takes the raw image as input, then different neurons along the depth dimension may activate in the presence of various oriented edges, or blobs of color.
2. Stride controls how depth columns around the spatial dimensions (width and height) are allocated. When the stride is one the filters are moved one pixel at a time. This leads to heavily overlapping receptive fields between the columns, and also to large output volumes. When the stride is two (or rarely three or more) then the filters jump two pixels at a time as they slide around. The receptive fields overlap less and the resulting output volume has smaller spatial dimensions.

3. Sometimes it is convenient to pad the input with zeros on the border of the input volume. Padding provides control of the output volume spatial size. In particular, sometimes it is desirable to exactly preserve the spatial size of the input volume.

A parameter sharing scheme is used in convolutional layers to control the number of free parameters. It relies on a reasonable assumption that if a patch feature is useful to compute at some spatial position, then it should also be useful to compute at other positions. In other words, denoting a single two-dimensional slice of depth as a depth slice, the neurons in each depth slice are constrained to use the same weights and bias.

Since all neurons in a single depth slice share the same parameters, the forward pass in each depth slice of the CONV layer can be computed as a convolution of the neuron's weights with the input volume (hence the name: convolutional layer). Therefore, it is common to refer to the sets of weights as a filter (or a kernel), which is convolved with the input. The result of this convolution is an activation map, and the set of activation maps for each different filter are stacked together along the depth dimension to produce the output volume.

Another feature of CNNs is pooling which is a form of nonlinear down-sampling. There are several nonlinear functions to implement pooling among which max pooling is the most common. It partitions the input image into a set of non-overlapping rectangles and, for each such sub-region, outputs the maximum. The intuition is that the exact location of a feature is less important than its rough location relative to other features. The pooling layer serves to progressively reduce the spatial size of the representation, to reduce the number of parameters and amount of computation in the network, and hence to also control overfitting. In addition to max pooling, the pooling units can use other functions, such as average pooling or L2-norm pooling.

Finally, after several convolutional and max pooling layers, the high-level reasoning in the neural network is done via fully connected layers. Neurons in a fully connected layer have connections to all activations in the previous layer, as seen in regular neural networks.

In essence CNNs work under the assumption of spatially correlated input domain, meaning nearby pixels have a special correlation to one another. This gives rise to the ability of weight compaction (i.e. utilizing a relatively small kernel instead of full mesh) under the assumption that locality plays a key role in the input-output correlation that is learned by the CNN.

Typically, CNN layers operate sequentially (i.e. row by row) on the input domain of each layer. This is not, however, necessarily the ideal order of implementation. Many times, valuable information in an image is focus-centered, i.e. there are one or more regions where it is desirable to place more attention and for which more elaborate evaluation is required.

There is thus a need for an ANN and particularly a CNN that recognizes and takes advantage of the fact that valuable information in an image is typically not distributed throughout the image but rather is concentrated in one or more regions.

SUMMARY OF THE INVENTION

The present invention is an artificial neural network that incorporates emphasis and focus techniques to extract more information from one or more portions of an input image compared to the rest of the image. The ANN recognizes that valuable information in an input image is typically not distributed throughout the image but rather is concentrated in one or more regions.

Rather than implement CNN layers sequentially (i.e. row by row) on the input domain of each layer, the present invention leverages the fact that valuable information is typically focused in one or more regions of the image where it is desirable to apply more attention and for which it is worth applying (or required to apply) more elaborate evaluation.

The invention takes into account a fundamental property of human vision, and more generally, any processing intense computation of a large input domain where attention is not uniform across the entire input domain but rather drawn to the 'center-of-mass' of most interesting 'action' or emphasis. Human visual perception is very efficient at this by extracting more information at the center and less information on the periphery.

Thus, the invention is a technique for applying emphasis and focus on one or more regions of an input image. This provides an opportunity to apply precision dilution to those portions of the input image that are not the center of focus and emphasis thereby providing several advantages including (1) reducing computation resource requirements, (2) reducing power consumption, (3) reducing semiconductor real estate, and (4) reducing processing time and latency.

The invention achieves this through application of a spatial aware function to the first convolutional layer. A spatially aware re-ordering function is applied to the data that re-arranges the information in a descending (or ascending) importance order. Dilution of precision is performed either before and/or after the first convolutional layer. Reordering of the pixels (or results of the convolution) provides an opportunity to, for example, apply different kernel sizes to different parts of the image, drop one or more pixels, feed groups of different convolution results to different downstream neural networks, and apply different bit precision to different groups of pixels or convolution results.

This, additional, and/or other aspects and/or advantages of the embodiments of the present invention are set forth in the detailed description which follows; possibly inferable from the detailed description; and/or learnable by practice of the embodiments of the present invention.

There is thus provided in accordance with the invention, a method of implementing a convolutional neural network (CNN), the method comprising receiving a frame buffer of pixels representing an input image, convolving a first convolutional kernel with the frame buffer of pixels in accordance with a spatial aware function, and wherein the spatial aware function is adapted to emphasize and focus on one or more portions of the input image whereby portions of the image having higher spatial significance are convolved before portions having lower spatial significance.

There is also provided in accordance with the invention, a convolutional neural network (CNN) having emphasis and focus capability, comprising a frame buffer of pixels representing an input image, a convolution circuit operative to convolve a first convolutional kernel with the frame buffer of pixels in accordance with a spatial aware function, and wherein the spatial aware function is adapted to emphasize and focus on one or more portions of the input image whereby portions of the image having higher spatial significance are convolved before portions having lower spatial significance.

There is further provided in accordance with the invention, a method of implementing an artificial neural network (ANN), the method comprising receiving an input image comprising a plurality of pixels, reordering a sequence of operations on the input image such that pixels of higher spatial importance are operated on first, and applying precision dilution to the input image after and/or before the operation thereby extracting more information from those portions of emphasis and focus compared with the rest of the input image.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein.

DETAILED DESCRIPTION

Figure 1:
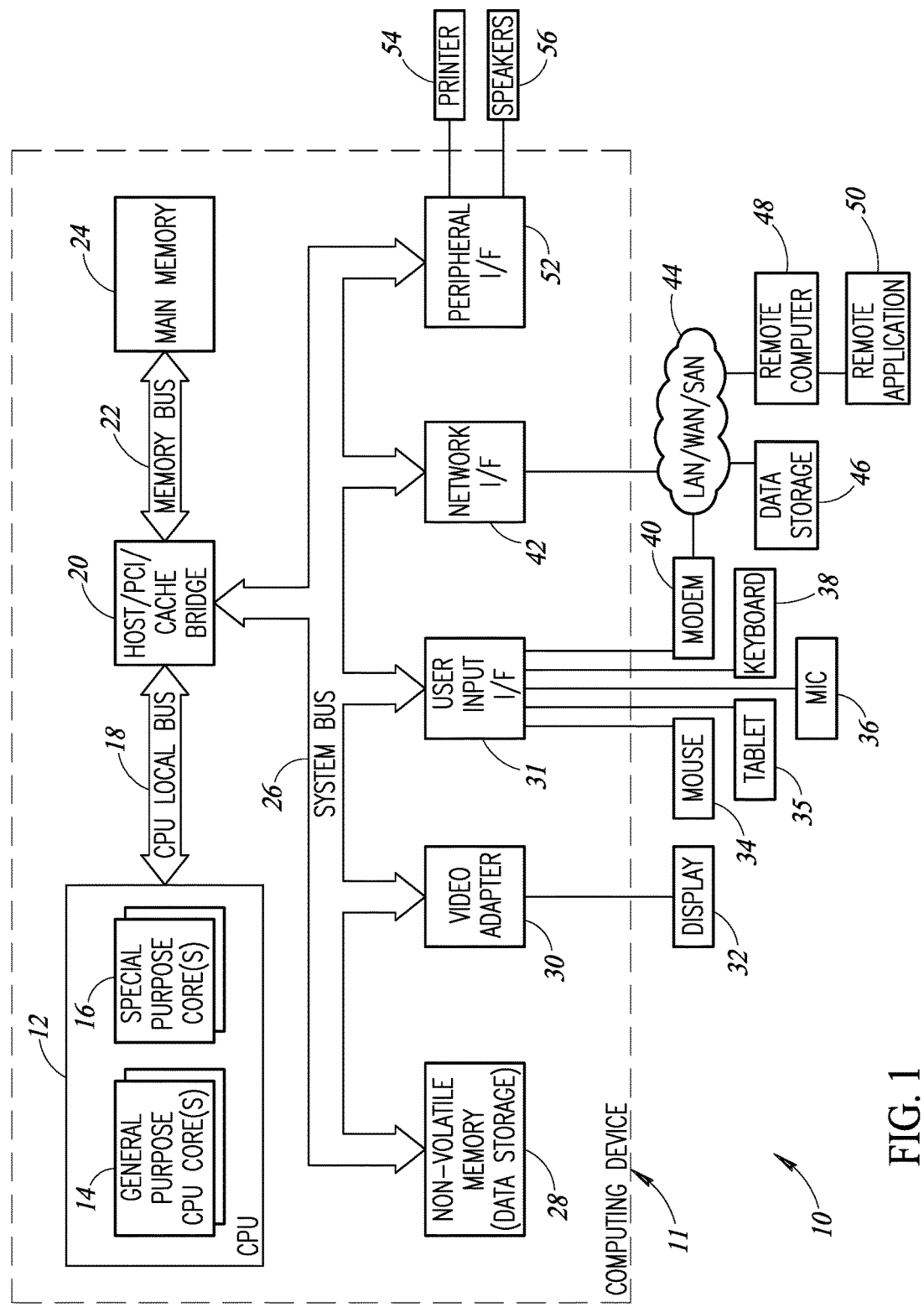
FIG. 1 is a block diagram illustrating an example computer processing system adapted to implement one or more portions of the present invention.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain or store the program for use by or in connection with the instruction execution system, apparatus, or device.

Computer program code for carrying out operations of the present invention may be written in any combination of one or more programming languages, including an object-oriented programming language such as Java, Smalltalk, C++, C# or the like, conventional procedural programming languages, such as the "C" programming language, and functional programming languages such as Prolog and Lisp, machine code, assembler or any other suitable programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network using any type of network protocol, including for example a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented or supported by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The invention is operational with numerous general purpose or special purpose computing system environments or configurations. Examples of well-known computing systems, environments, and/or configurations that may be suitable for use with the invention include, but are not limited to, personal computers, server computers, cloud computing, hand-held or laptop devices, multiprocessor systems, microprocessor, microcontroller or microcomputer based systems, set top boxes, programmable consumer electronics, ASIC or FPGA core, DSP core, network PCs, minicomputers, mainframe computers, distributed computing environments that include any of the above systems or devices, and the like.

In addition, the invention is operational in systems incorporating sensors such as found in automated factories, in mobile devices such as tablets and smartphones, smart meters installed in the power grid and control systems for robot networks. In general, any computation device that can host an agent can be used to implement the present invention.

A block diagram illustrating an example computer processing system adapted to implement the neural network of the present invention is shown in FIG. 1. The exemplary computer processing system, generally referenced 10, for implementing the invention comprises a general-purpose computing device 11. Computing device 11 comprises central processing unit (CPU) 12, host/PIC/cache bridge 20 and main memory 24.

The CPU 12 comprises one or more general purpose CPU cores 14 and optionally one or more special purpose cores 16 (e.g., DSP core, floating point, GPU, and neural network optimized core). The one or more general purpose cores execute general purpose opcodes while the special purpose cores execute functions specific to their purpose. The CPU 12 is coupled through the CPU local bus 18 to a host/PCI/cache bridge or chipset 20. A second level (i.e. L2) cache memory (not shown) may be coupled to a cache controller in the chipset. For some processors, the external cache may comprise an L1 or first level cache. The bridge or chipset 20 couples to main memory 24 via memory bus 20. The main memory comprises dynamic random access memory (DRAM) or extended data out (EDO) memory, or other types of memory such as ROM, static RAM, flash, and non-volatile static random access memory (NVSRAM), bubble memory, etc.

The computing device 11 also comprises various system components coupled to the CPU via system bus 26 (e.g., PCI). The host/PCI/cache bridge or chipset 20 interfaces to the system bus 26, such as peripheral component interconnect (PCI) bus. The system bus 26 may comprise any of several types of well-known bus structures using any of a variety of bus architectures. Example architectures include Industry Standard Architecture (ISA) bus, Micro Channel Architecture (MCA) bus, Enhanced ISA (EISA) bus, Video Electronics Standards Associate (VESA) local bus and Peripheral Component Interconnect (PCI) also known as Mezzanine bus.

Various components connected to the system bus include, but are not limited to, non-volatile memory (e.g., disk based data storage) 28, video/graphics adapter 30 connected to display 32, user input interface (I/F) controller 31 connected to one or more input devices such mouse 34, tablet 35, microphone 36, keyboard 38 and modem 40, network interface controller 42, peripheral interface controller 52 connected to one or more external peripherals such as printer 54 and speakers 56. The network interface controller 42 is coupled to one or more devices, such as data storage 46, remote computer 48 running one or more remote applications 50, via a network 44 which may comprise the Internet cloud, a local area network (LAN), wide area network (WAN), storage area network (SAN), etc. A small computer systems interface (SCSI) adapter (not shown) may also be coupled to the system bus. The SCSI adapter can couple to various SCSI devices such as a CD-ROM drive, tape drive, etc.

The non-volatile memory 28 may include various removable/non-removable, volatile/nonvolatile computer storage media, such as hard disk drives that reads from or writes to non-removable, nonvolatile magnetic media, a magnetic disk drive that reads from or writes to a removable, nonvolatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

A user may enter commands and information into the computer through input devices connected to the user input interface 31. Examples of input devices include a keyboard and pointing device, mouse, trackball or touch pad. Other input devices may include a microphone, joystick, game pad, satellite dish, scanner, etc.

The computer 11 may operate in a networked environment via connections to one or more remote computers, such as a remote computer 48. The remote computer may comprise a personal computer (PC), server, router, network PC, peer device or other common network node, and typically includes many or all of the elements described supra. Such networking environments are commonplace in offices, enterprise-wide computer networks, intranets and the Internet.

When used in a LAN networking environment, the computer 11 is connected to the LAN 44 via network interface 42. When used in a WAN networking environment, the computer 11 includes a modem 40 or other means for establishing communications over the WAN, such as the Internet. The modem 40, which may be internal or external, is connected to the system bus 26 via user input interface 31, or other appropriate mechanism.

The computing system environment, generally referenced 10, is an example of a suitable computing environment and is not intended to suggest any limitation as to the scope of use or functionality of the invention. Neither should the computing environment be interpreted as having any dependency or requirement relating to any one or combination of components illustrated in the exemplary operating environment.

In one embodiment, the software adapted to implement the system and methods of the present invention can also reside in the cloud. Cloud computing provides computation, software, data access and storage services that do not require end-user knowledge of the physical location and configuration of the system that delivers the services. Cloud computing encompasses any subscription-based or pay-per-use service and typically involves provisioning of dynamically scalable and often virtualized resources. Cloud computing providers deliver applications via the internet, which can be accessed from a web browser, while the business software and data are stored on servers at a remote location.

In another embodiment, software adapted to implement the system and methods of the present invention is adapted to reside on a computer readable medium. Computer readable media can be any available media that can be accessed by the computer and capable of storing for later reading by a computer a computer program implementing the method of this invention. Computer readable media includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Communication media typically embodies computer readable instructions, data structures, program modules or other data such as a magnetic disk within a disk drive unit. The software adapted to implement the system and methods of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the system and methods of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk, CDROM, DVD, flash memory, portable hard disk drive, etc. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

Figure 2:
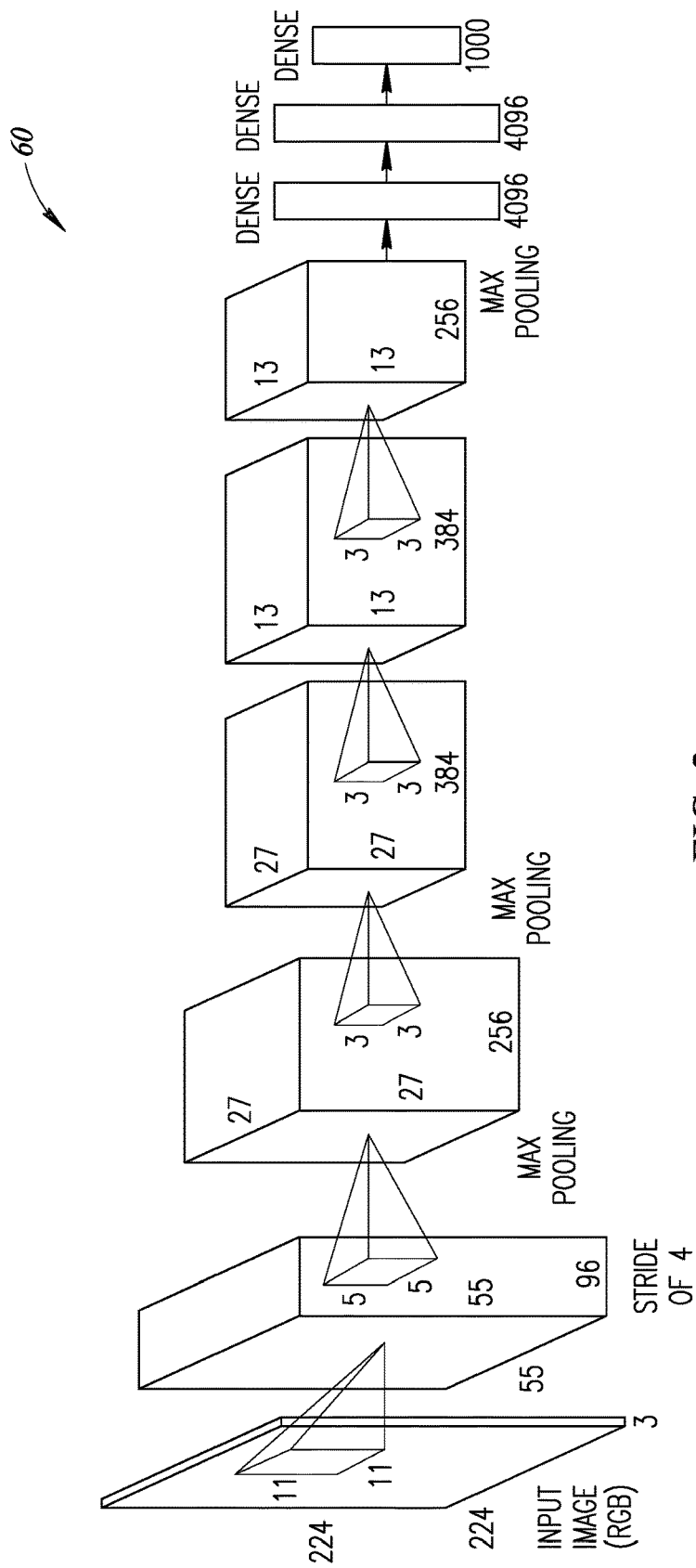
FIG. 2 is a diagram illustrating an example convolutional neural network (CNN)

A diagram illustrating an example convolutional neural network (CNN) is shown in FIG. 2. The CNN, generally referenced 60, comprises a 224×224 pixel by three pixel deep RGB input image. An 11×11 kernel is applied to the input image in a first convolutional layer to generate a 55×55 pixel by 96 features result. After additional convolutional layers and max pooling steps, a 1000 feature resultant output is generated.

Figure 3:
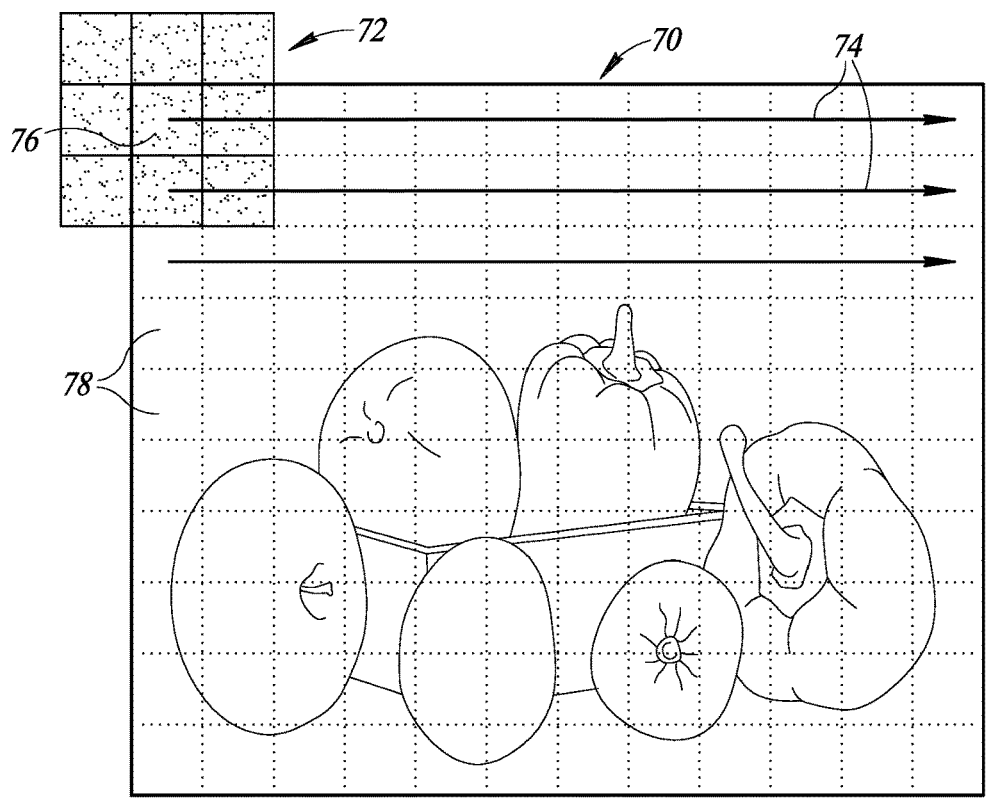
FIG. 3 is a diagram illustrating a first example CNN operation in a sequential manner on an input image.

A diagram illustrating a first example CNN operation in a sequential manner on an input image is shown in FIG. 3. In one embodiment, the pixels 78 making up image 70 are processed by the first convolutional layer in a sequential manner. The example 3×3 kernel 72 moves sequentially row by row from left to right, for example see arrows 74. The centroid 76 begins in the upper left corner and moves across the first row. Once the first row is complete, the kernel moves onto the beginning of the second row and so on until the last pixel in the bottom right corner is convolved. Since the input image is an RGB image, three convolution results are generated for each pixel. These three results are summed to yield a pixel in the subsequent layer.

Note that the same single kernel is used for the entire input image for a given feature. Note also, however, that approximately one third of the input image consists of pixels that are not important and may comprise 'noise' compared to the important portions of the image, e.g., the pieces of fruit and vegetables. Thus, the valuable information is emphasized (or focused) in one or more portions of the image. In this example image, the focus is on the pieces of fruit and vegetables in the lower two thirds of the image. The present invention leverages the fact that valuable information is typically grouped together and not distributed over the image. In other words, there are one or more regions of the image where more attention is to be drawn and for which more elaborate evaluation is required. Referring to the example image, more computing resources for analysis can be allocated to the pixels making up the fruit and vegetables while less resources can be allocated to pixels making up the rest of the image since these pixels are less importation (i.e. valuable) and thus less attention can be applied to them.

Figure 4:
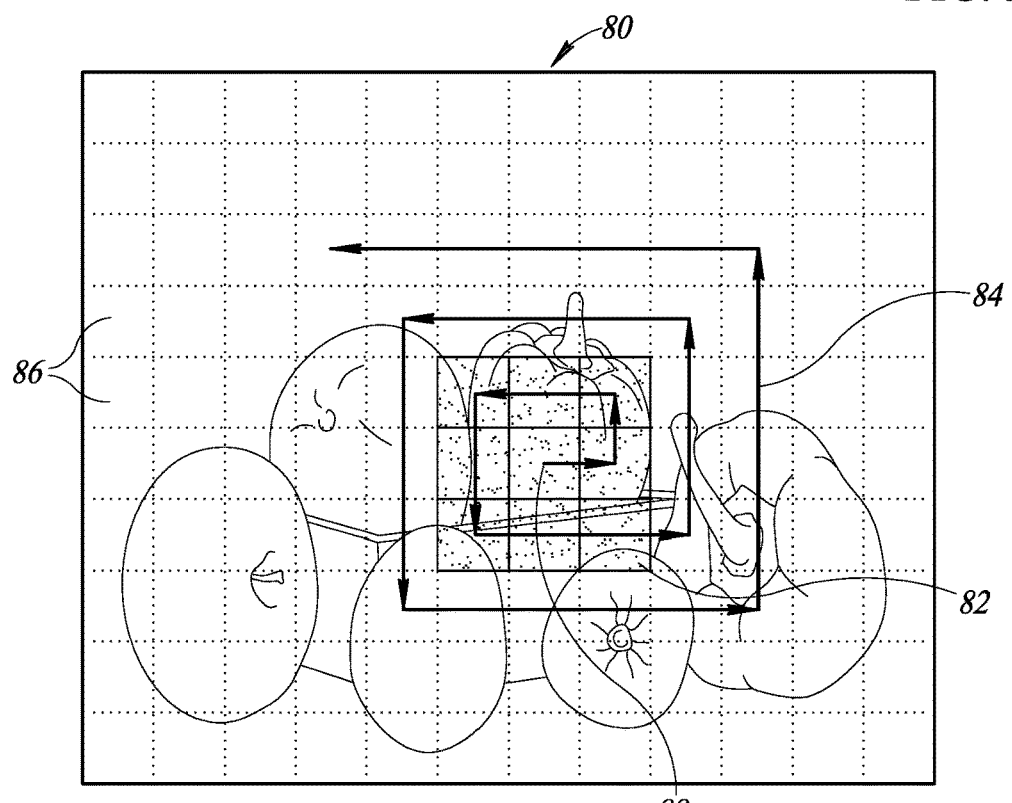
FIG. 4 is a diagram illustrating a second example CNN operation applying emphasis and focus on an input image.

A diagram illustrating a second example CNN operation applying emphasis and focus on an input image is shown in FIG. 4. In this embodiment, rather than move the kernel 82 sequentially over the pixels 86 of the image 80, the convolutional layer processing begins with the kernel 82 and corresponding centroid 88 placed on pixels in the more valuable portion of the image. In this example, the 3×3 kernel 82 moves in a spiral fashion over the pixels of the image as shown in the arrows 84 showing the path of the kernel. In this manner, the more important pixels are convolved first.

Thus, the attention placed on the pixels of the image is not uniform across the entire input domain but rather is drawn to one or more centers of mass (i.e. areas of emphasis or focus) having the most interesting 'action'. This is similar to a fundamental property of human vision in that visual perception is more efficient at the center of vision than at the periphery. More information is extracted at the center of vision and less at the periphery. As the kernel moves away from the center of the focus or emphasis, less attention is required. The pixels of the input image are thus convolved in order of priority, with the higher priority pixels convolved before the less important pixels. For example, larger sized kernels can be used for convolution of higher priority pixels while smaller sized kernels used for pixels of lower priority. Alternatively, for example, dilution of precision can be applied for the pixels of lower priority. Examples of precision dilution include pixel dropout, reduction of bit width, reduction of number of features, pixel dilation, pooling (e.g., averaging, maximum), changing stride, etc. Several of these are illustrated in more detail infra.

Figure 5:
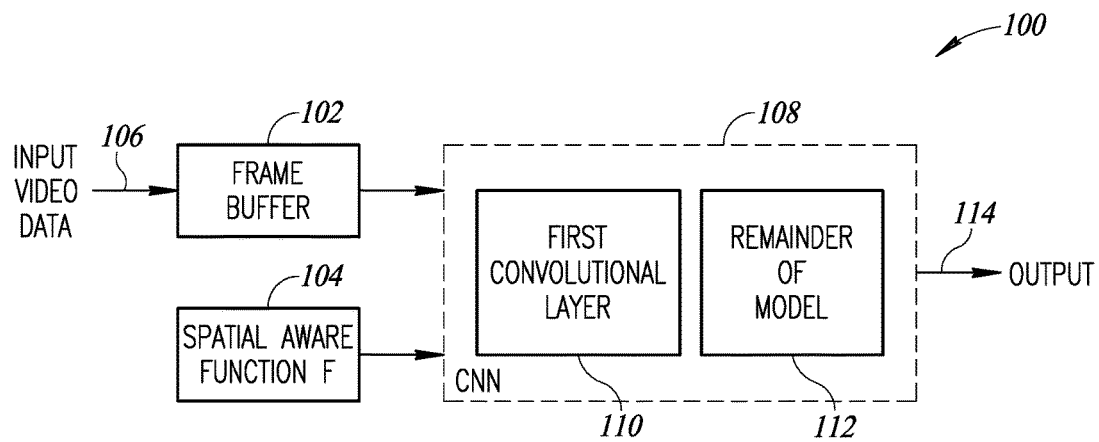
FIG. 5 is a block diagram illustrating an example application of a spatial aware function to the first convolutional layer in a CNN.

A block diagram illustrating an example application of a spatial aware function to the first convolutional layer in a CNN is shown in FIG. 5. The system, generally referenced 100, comprises a frame buffer 102 configured to receive input video data 106, a spatial aware function F 104, and a CNN 108 incorporating a first convolutional layer 110 and the remainder of the model 112.

The spatial aware function F 104 embodies the rearrangement order of applying the convolution to the input image. In other words, it provides the a priori mapping of the output pixels of each output feature such that portions of the image having higher spatial important appear first. The rearranged output image can then be manipulated further.

It is noted that the spatial aware function can be applied before or after the first convolutional layer. When applied before, the pixels of the input image are first rearranged in accordance with the spatial function. For example, the contents of the frame buffer are rewritten such that the pixels are now in order of importance. With the first pixel in the frame buffer of highest important and the last pixel in the frame buffer of lowest importance. The convolution kernel is then applied sequentially across the rearranged frame buffer contents to generate an output buffer of convolution results in spatial order.

Alternatively, the spatial aware function can be applied after the first convolutional layer. When applied after, the pixels in the frame buffer remain in their original location. The order of the convolution, however, proceeds in accordance with the spatial function. Thus, the convolution kernel does not necessarily begin with the first pixel in the frame buffer but rather with the pixel at the center of the focus or emphasis.

Regardless of the implementation, the convolution of size K×K and stride S is applied to the image of size M×N at location F(i) where i=0 . . . N*M−1. The result is a rearranged version of the first convolutional layer outputs.

Note that the CNN model is trained using the spatial aware function and the weights used reflect the rearranged version of the input image. Once trained, the inference operates in the same manner using the rearranged input image. For localization tasks, the inverse function $F^1$ is applied in order to trace the location in the original image space domain.

Figure 6:
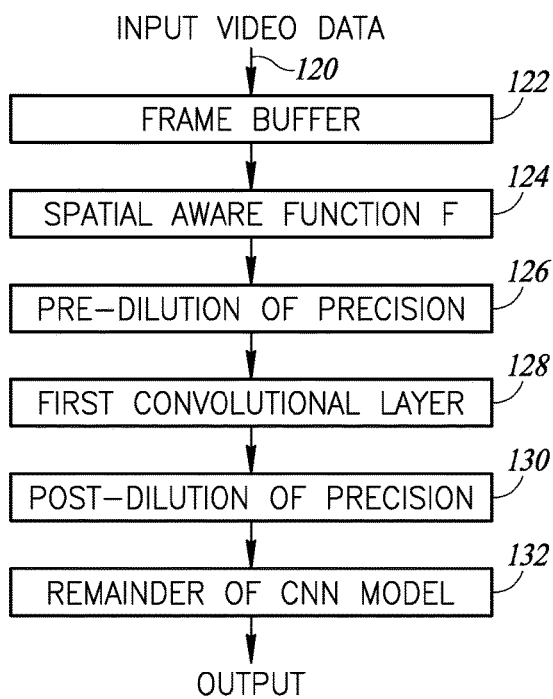
FIG. 6 is a block diagram illustrating an example CNN processing flow including optional pre and post dilution of precision.

A block diagram illustrating an example CNN processing flow including optional pre and post dilution of precision is shown in FIG. 6. Initially, the input video data 120 is stored in a frame buffer 122. A spatial aware function F 124 is applied to the frame buffer. Optional pre-dilution of precision 126 is applied to the contents of the frame buffer. A convolution 128 is then performed over the contents of the frame buffer in accordance with the spatial function. Optional post dilution of precision 130 is then performed on the convolution results and the mechanism continues with the remainder of the CNN model.

Note that typically, at least one of pre and post dilution of precision is performed. In one embodiment, both pre and post dilution of precision are performed. The application of precision dilution is what generates the reduction in the required computing resources for a particular CNN. Examples of precision dilution include pixel dropout, reduction of bit width, reduction of number of features, pixel dilation, pooling (e.g., averaging, maximum), and changing stride.

Also note that as described supra the application of the spatial aware function may be realized (1) by rearranging the contents of the frame buffer first and then performing a sequential convolution (as shown in FIG. 3) or (2) performing the convolution on the contents of the original frame buffer first but in an order dictated by the spatial aware function. In either case, the result is the same, i.e. convolution results in order of desired emphasis and focus.

Figure 7:
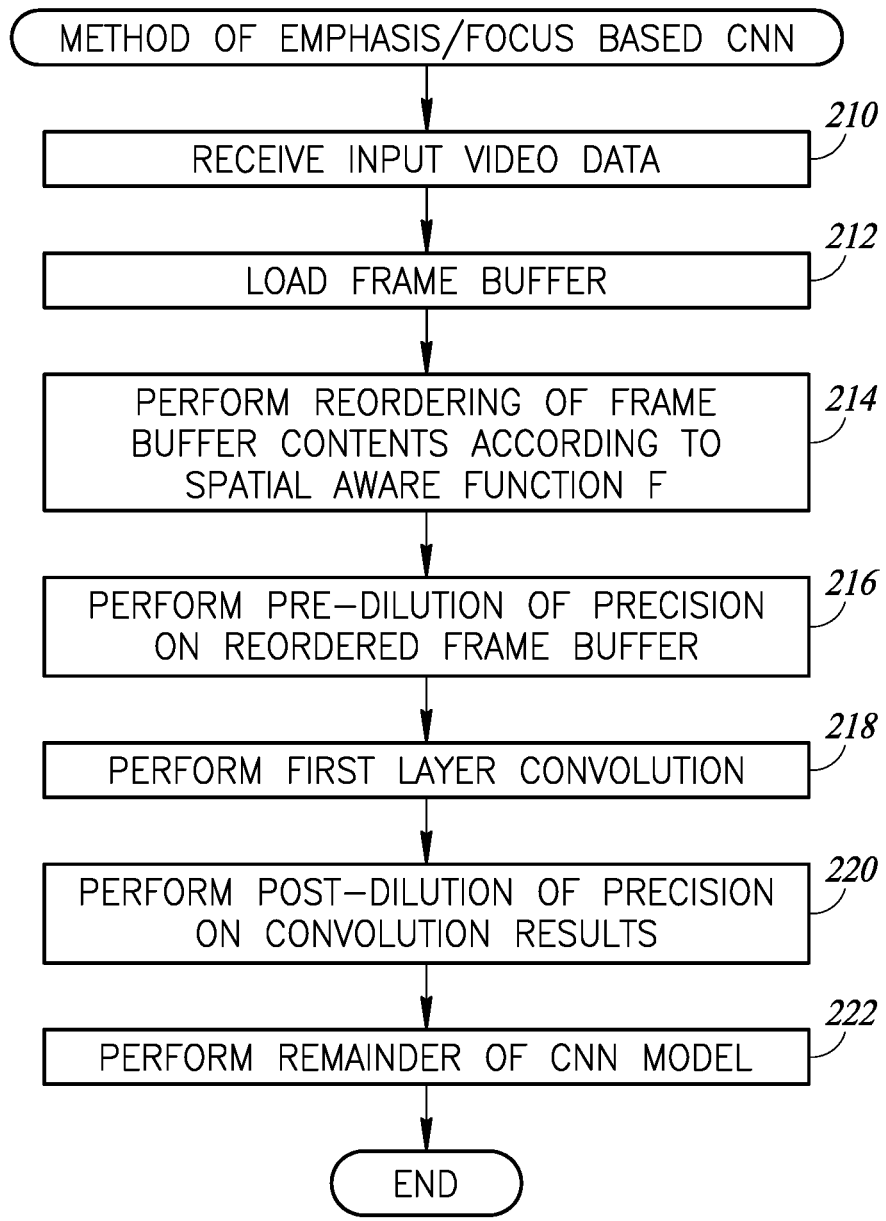
FIG. 7 is a flow diagram illustrating an example method of implementing an emphasis and focus based CNN.

A flow diagram illustrating an example method of implementing an emphasis and focus based CNN is shown in FIG. 7. Note that this method and the mechanism of the present invention is applicable not only to CNNs but also to fully connected MLP networks. The benefit of the invention to MLP networks is less than that to CNNs. With fully connected MLPs the main benefit is dilution of precision and the advantages associated therewith as the notion of kernels and strides is irrelevant. In this case, the spatial aware function can be applied directly to the input image.

The first step in the method is to receive the input video data (step 210). A frame buffer is then loaded with the video data (step 212). Depending on the implementation the contents of the frame buffer are then reordered in accordance with the spatial aware function F (step 214). Alternatively, as described supra, the contents of the frame buffer remain intact and the spatial function dictates the order of the convolution across the image. Optional pre dilution of precision is then performed on the reordered frame buffer (or on the frame buffer in its original order) (step 216).

The first layer convolution is then performed on the contents of the frame buffer (step 218). Either the convolution is applied sequentially across the reordered frame buffer or in accordance with the spatial function across the original frame buffer. Optional post dilution of precision is then performed on the results of the convolution (step 220). The method continues with the remainder of the CNN model (step 222). Note that either pre or post dilution or both is applied during the execution of the method. It is noted that if neither pre or post dilution of precision is performed, the benefits of the present invention are limited in that only a reordering of the convolution results is provided. This is beneficial if the output pixels are divided whereby different groups of pixels are directed to different downstream CNNs. In this case, having the convolution results in order of visual importance is beneficial.

Figure 8:
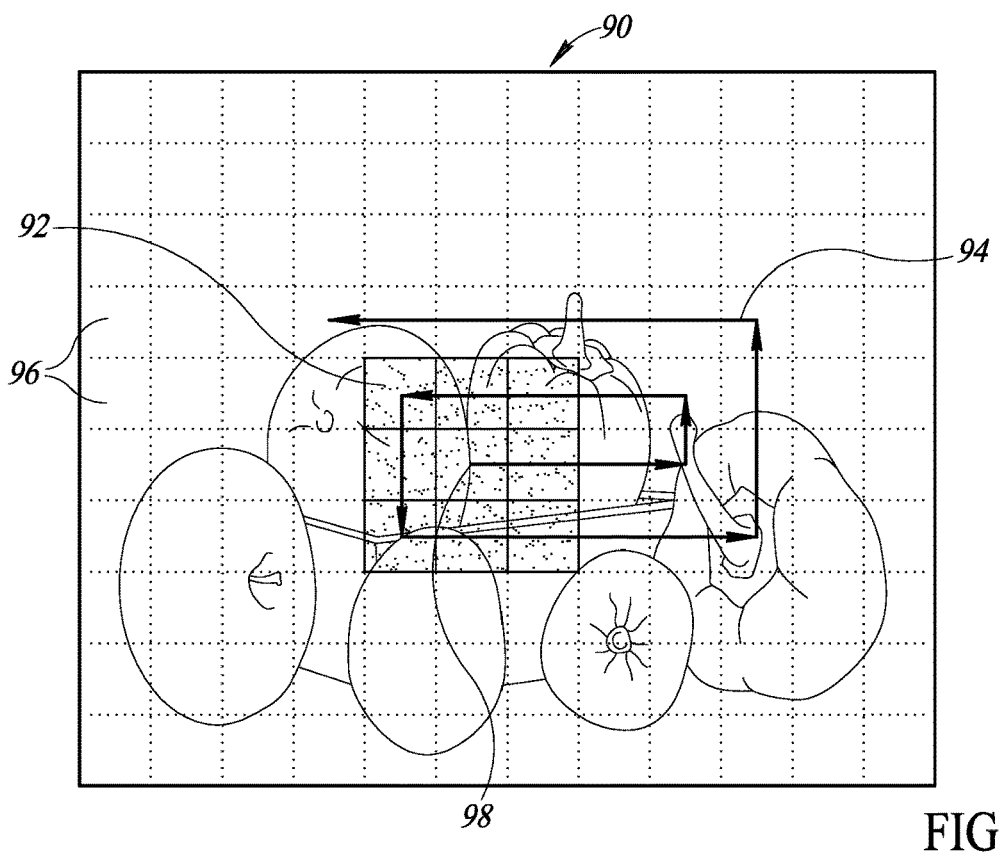
FIG. 8 is a diagram illustrating a third example CNN operation applying emphasis and focus on an input image.

A diagram illustrating a third example CNN operation applying emphasis and focus on an input image is shown in FIG. 8. In this example, the pixels 96 of the image 90 are convolved with the 3×3 kernel 92. The centroid 98 of the kernel is placed on the pixel at the center of the point of emphasis or focus in the image. The convolution continues along a path dictated by the spatial function F. The spiral shape traversed can have any desired width and length. In this example, the spiral is rectangular in shape rather than square as shown in FIG. 4. In another embodiment, for example, the spatial function F can have more emphasis on horizontal movement as opposed to vertical movement. This may be valid is a priori knowledge of the input image content and context are available (e.g., landscape or portrait orientation, aspect ratio, lens properties).

Note that a spiral shape is shown for illustration purposes only. It is appreciated that the path of the convolution can have any desired shape and is not limited to a spiral, rectangle or otherwise. A spiral is shown as an example due to its efficient coverage properties for emphasizing and focusing on a particular portion of the image.

Figure 9:
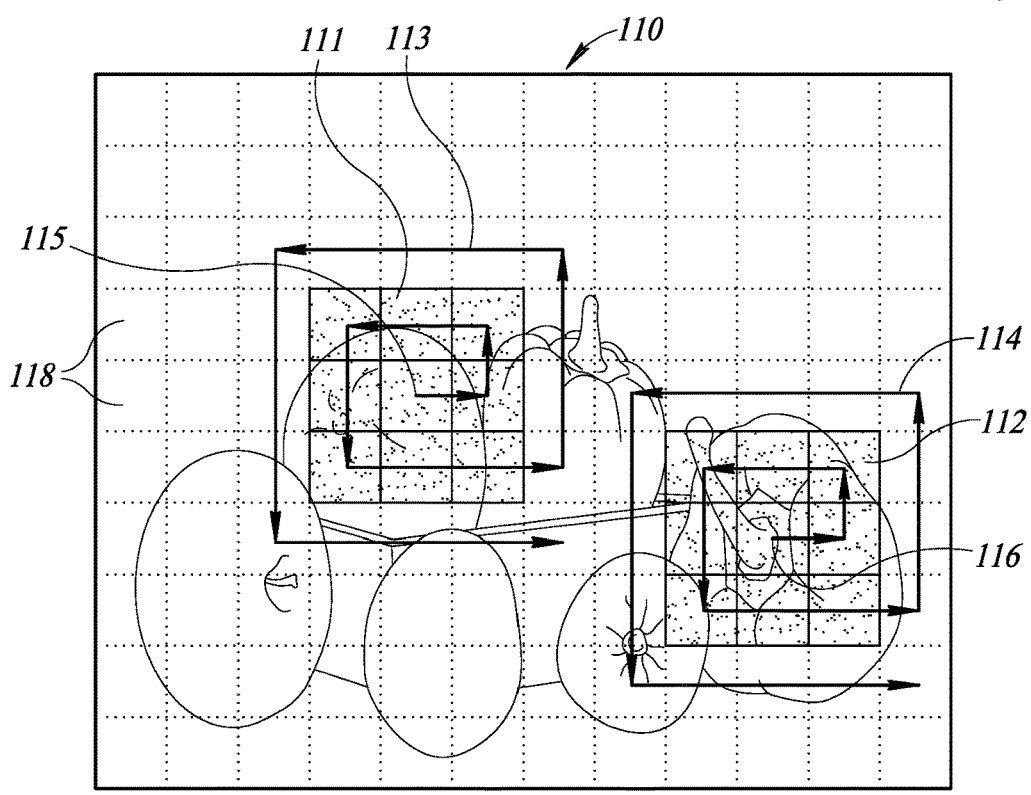
FIG. 9 is a diagram illustrating a fourth example CNN operation applying emphasis and focus on an input image.

A diagram illustrating a fourth example CNN operation applying emphasis and focus on an input image is shown in FIG. 9. As stated supra, there can be one or more portions of the image with more valuable information. In this example embodiment, there are two portions of the image 110 with more valuable information (i.e. portions of emphasis and focus). Therefore, the spatial function F is configured to represent both portions of emphasis and focus. For the first portion, the centroid 115 of the 3×3 kernel 111 begins convolution of pixels 118 centered therein and continues in a spiral shape according to arrows 113. For the second portion, the centroid 116 of the 3×3 kernel 112 begins convolution of pixels 118 centered therein and continues in a spiral shape according to arrows 114. The convolution results at the output of the first convolutional layer would be grouped by portion of focus with the first set of results corresponding to the convolution of pixels with the first kernel 111 and the second set of results corresponding to the convolution of pixels with the second kernel 112. Note that in the multi-focus technique described herein, several rearrangement functions (i.e. spatial functions) can be staggered together. The staggering can be performed in batches of size B=(1 . . . $N_B$). Note also that the two kernels are not necessarily the same and each may have any arbitrary size.

Figure 10:
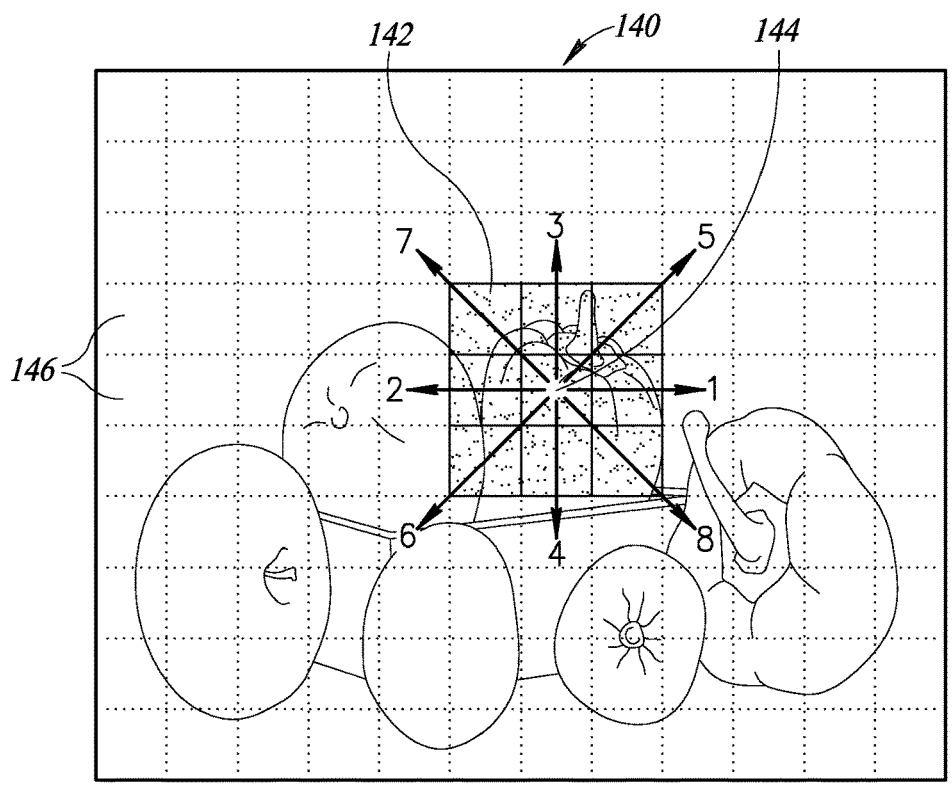
FIG. 10 is a diagram illustrating a fifth example CNN operation applying emphasis and focus on an input image.

A diagram illustrating a fifth example CNN operation applying emphasis and focus on an input image is shown in FIG. 10. In this example embodiment, an alternative spatial aware function is provided. Rather than traverse the pixels 146 of the image 140 in a spiral fashion, the kernel 142 moves along radial lines emanating from the center 144 of the portion of emphasis and focus as indicated by the numbered arrows pointing outward from the center pixel 144. The particular order the radial lines are traversed is not critical and is shown for illustration purposes only. It is appreciated that any desired spatial function can be used with the mechanism of the present invention and that the invention is not intended to be limited to the examples provided herewith.

Figure 11:
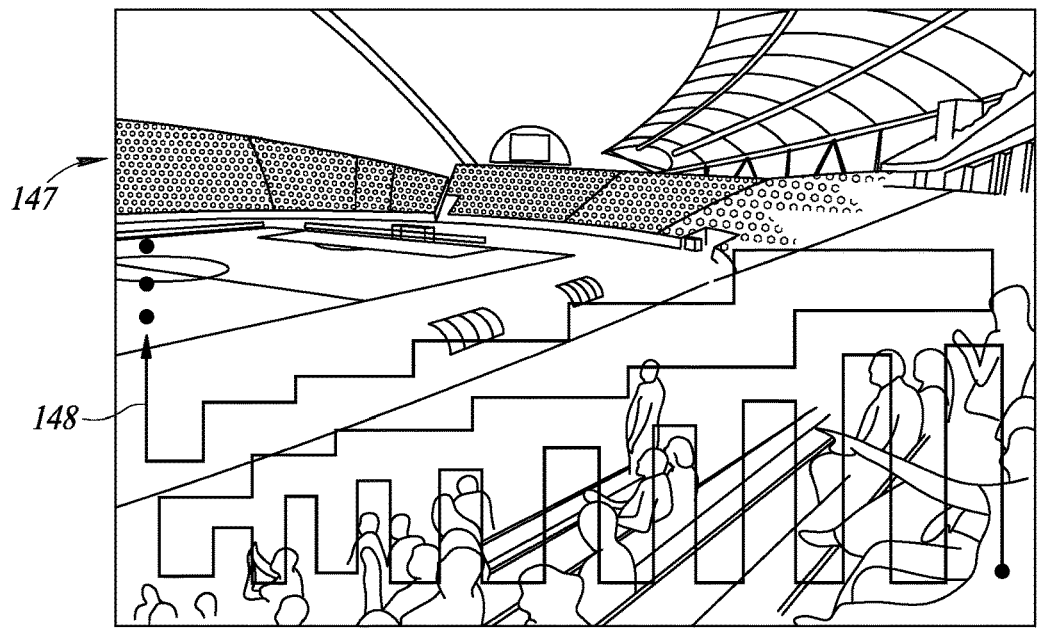
FIG. 11 is a diagram illustrating a sixth example CNN operation applying emphasis and focus on an input image.

A diagram illustrating a sixth example CNN operation applying emphasis and focus on an input image is shown in FIG. 11. In this example, an alternative spatial aware function is shown. The input image 147 is a scene at a soccer (i.e. football) game at a stadium. The emphasis or focus here is placed on the people seated in the stand. Hence, the spatial aware function in this case traverses the people in the stand closest to the camera as indicated by serpentine line 148. As a result, more elaborate evaluation is applied to the pixels making up the people seated in the stand close to the camera. Less evaluation is applied to pixels outside this region. Therefore, dilution of precision can be applied to the image in accordance with the spatial function whereby a bias is imposed and the pixels in the region of focus and emphasis are convolved first and with higher information extraction than pixels outside the region of focus.

It is appreciated that any spatial function (i.e. rearrangement function) can be applied as long as the result of the reordering serves some purpose in subsequent processing. Application of a spatial function to the input image as described supra makes it much easier to apply dilution of precision across the input space domain, replacing the homogenous nature of typical convolutional layers. As described supra, this can be achieved in several ways: (1) dilution of first convolutional layer via kernel size, stride and quantization across input location, e.g., changing the kernel size while traversing spatial function F; (2) dilution through pooling layer, e.g., applying stronger pooling (i.e. averaging, maximum) as a function of location at the output of the first convolutional layer; (3) using less precision for information as a function of location along the output frames; (4) dropping out of pixels (i.e. from convolution calculations); (5) reduction of number of features; and (6) pixel dilation.

Figure 12A:
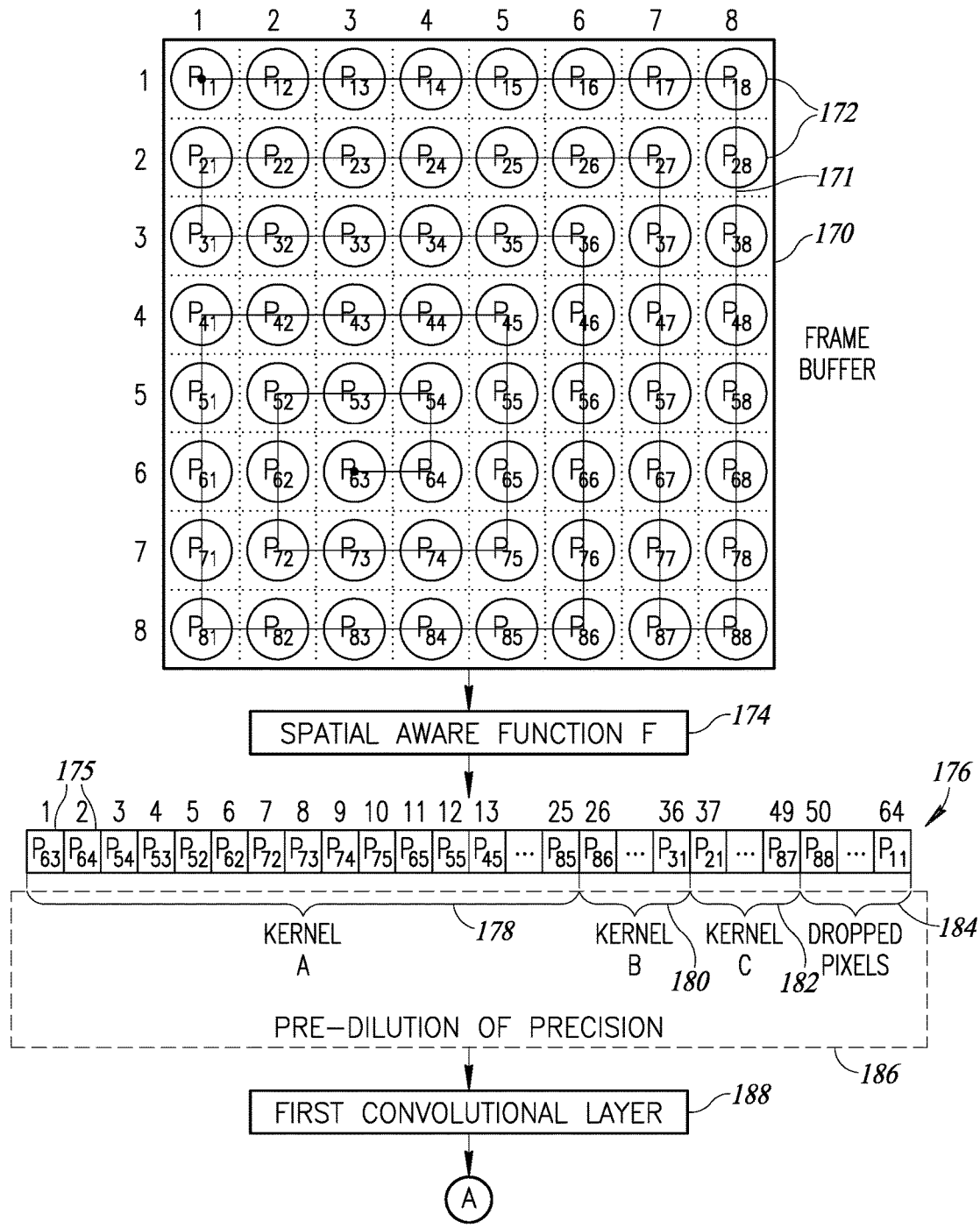
FIGS. 12A and 12B is a diagram illustrating a second example application of a spatial aware function to the first convolutional layer in a CNN in more detail.
Figure 12B:
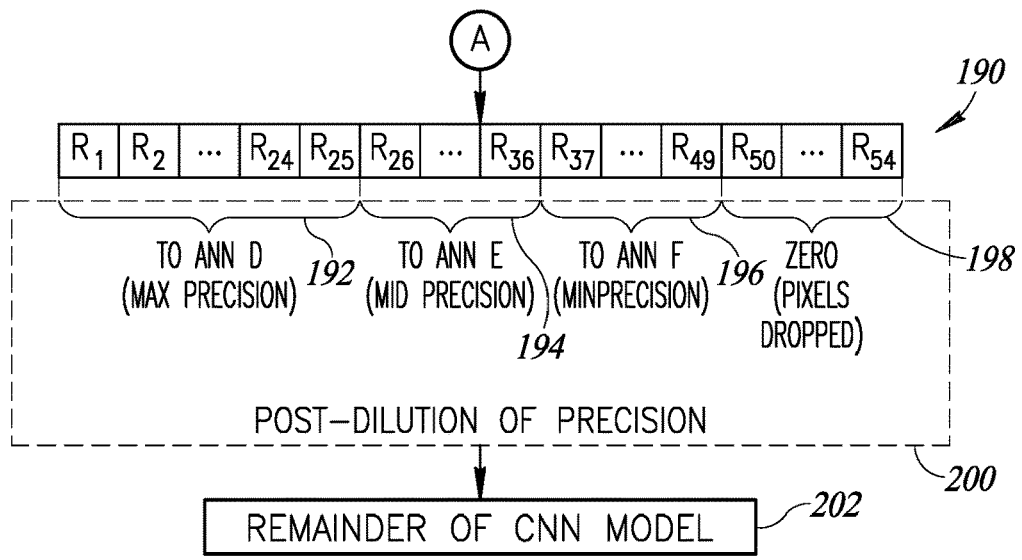

A diagram illustrating a second example application of a spatial aware function to the first convolutional layer in a CNN in more detail is shown in FIGS. 12A and 12B. In this example, the video signal data making up an input image of size N×M (where N and M equal 8) is stored as pixels 172 in frame buffer 170. The pixels are labeled with row-column subscripts, i.e. $P_{11}$ in the top left corner through $P_{88}$ in the lower right corner. The spatial aware function in this example is a spiral starting at the single portion of emphasis and focus pixel $P_{63}$. The path of the spatial function is indicated by the serpentine line 171 which starts on pixel $P_{63}$ and ends at pixel $P_{11}$.

An example spatial aware function is provided below in Listing 1. This example function corresponds to the spatial function shown in FIG. 12A (serpentine line 171).

Listing 1: Example Spatial Aware Function

```
Notation:
x_s, y_s: starting point (x, y) pixel coordinates
x_n, y_n: next pixel value
W, H: frame width and height, respectively.
n: pixel index
$CLAMP (v, min, max): a clamp function which ensures 'v' is
clamped to min/max values accordingly (i.e. if v<min it is set to
min and if v>max it is set to max)
Pseudo Code:
/* Initialize */
x_n = x_s
y_n = y_s
n = 0
stage = 1
direction = 1
/* Run */
while (n < W x H)
{
    for offset = 1.. stage
        x_n = $CLAMP ( x_n + direction, 0, W)
    direction = –direction;
    for offset = 1.. stage
        y_n = $CLAMP ( y_n + direction, 0, H)
    n = n + 2·stage
    stage++
}
```

In the case where the contents of the frame buffer are rearranged before convolution, the pixels are reordered in accordance with the spatial aware function F 174. The resultant pixels 175 of the frame buffer 176 after reordering is shown. The order of the pixels follows that of the spatial aware function. Pre-precision dilution 186 is then optionally applied before the convolution step. In this example, the reordered pixels of the frame buffer are divided into four groups. The first group of pixels 178 $P_{63}$ through $P_{85}$ is assigned a relatively large kernel A. A second group of pixels 180 $P_{86}$ through $P_{31}$ is assigned a medium sized kernel B. A third group of pixels 182 $P_{21}$ through $P_{87}$ is assigned a relatively small kernel C. A fourth group of pixels 184 $P_{88}$ through $P_{11}$ is dropped. In this example, the kernel size is reduced in accordance with the priority of the pixels. Thus, pixels of most importance are assigned a larger kernel (i.e. kernel A) to extract additional information, while pixels of lesser important are assigned smaller kernels to extract less information, and so on to the least important pixels which are dropped from the convolution.

In the case where the contents of the frame buffer remain intact before convolution, the spatial function is used to guide the path of the convolution 188 through the content of the frame buffer. The pre-dilution of precision 186 is adapted to apply different kernels of varying sizes to the different groups of pixels. In addition, the least important pixels in the image are dropped. The kernels used for the convolution varies from depending on the particular group of pixels. For example, kernel A of size $K_A \times K_A$ and stride $S_A$ is used for the convolution of pixels $P_{63}$ through $P_{85}$; kernel B of size $K_B \times K_B$ and stride $S_B$ is used for the convolution of pixels $P_{86}$ through $P_{31}$; kernel C of size $K_C \times K_C$ and stride $S_C$ is used for the convolution of pixels $P_{21}$ through $P_{87}$; while pixels $P_{88}$ through $P_{11}$ are dropped.

Following the first convolutional layer 188, in the post dilution of precision 200, the convolution results are divided into four portions. The first portion 192 includes result pixels $R_1$ through $R_{25}$ which are input having maximum precision to artificial neural network (ANN) D. The second portion 194 includes result pixels $R_{26}$ through $R_{36}$ which are input having medium precision to artificial neural network (ANN) E. The third portion 196 includes result pixels $R_{37}$ through $R_{49}$ which are input having minimum precision to artificial neural network (ANN) F. The fourth group of result pixels $R_{50}$ through $R_{54}$ are zeroed (i.e. dropped).

It is noted that the pre and post precision dilution applied are not necessarily related to one another and can be completely independent of each other. In addition, either pre-dilution of precision, post dilution of precision or both pre and post dilution of precision can be applied.

Note also that the example precision dilution of FIGS. 12A and 12B are for illustration purposes only. It is not intended that the invention be limited to these examples. In particular, precision dilution may include pixel dropout, reduction of bit width, reduction of number of features, pixel dilation, pooling (e.g., averaging, maximum), and change of stride.

Figure 13:
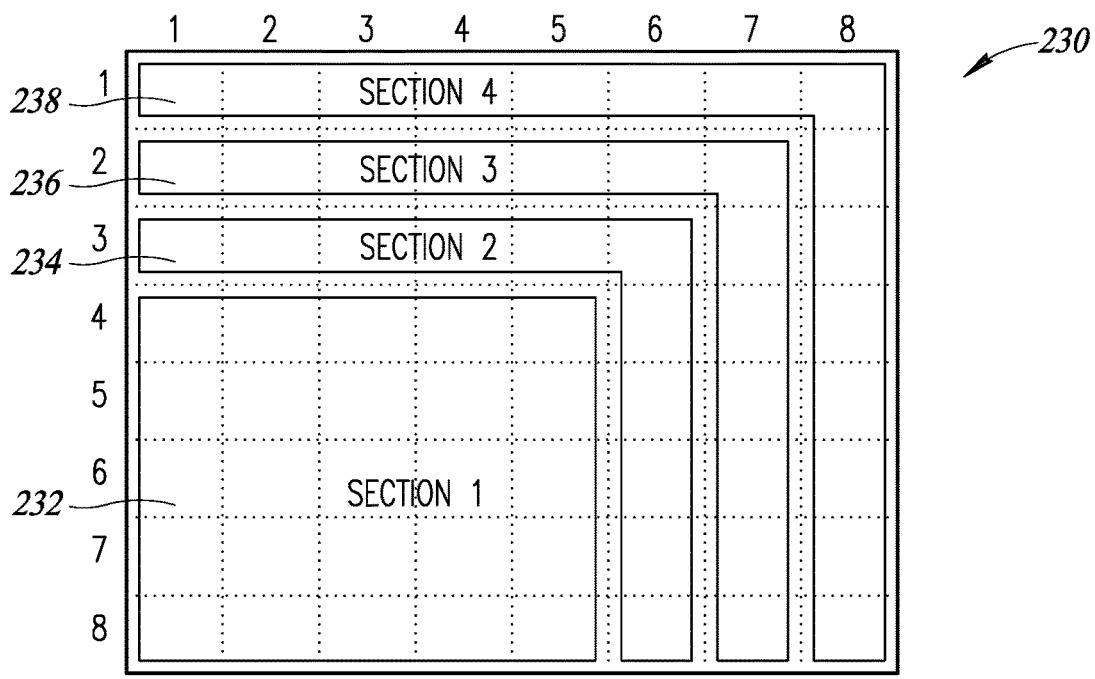
FIG. 13 is a diagram illustrating the application of an example spatial aware function to the first convolutional layer in a CNN.

A diagram illustrating the application of an example spatial aware function to the first convolutional layer in a CNN is shown in FIG. 13. The spatial aware function applied in this case corresponds to the spatial function applied to the first convolutional layer in FIGS. 12A and 12B. Section 1 (232) corresponds to pixels in group 178 (FIG. 12A) assigned kernel A; section 2 referenced 234 corresponds to pixels in group 180 assigned kernel B; section 3 referenced 236 corresponds to pixels in group 182 referenced 238 assigned kernel C; and section 4 referenced 238 corresponds to pixels in group 184 which are dropped from the first convolutional layer. Thus, different operations can be performed on the pixels in each section. In this example, different kernels are assigned to the various sections. It is appreciated that any desired operation can be applied to each section of pixels depending on the particular implementation. Regardless of the particular operation applied, however, the pixels in section 1 are considered more important and receive more attention than the pixels in sections 2, 3, and 4. A priority of importance is applied where section 1 is assigned the highest priority and descending to section 4 which is assigned the lowest priority.

Figure 14:
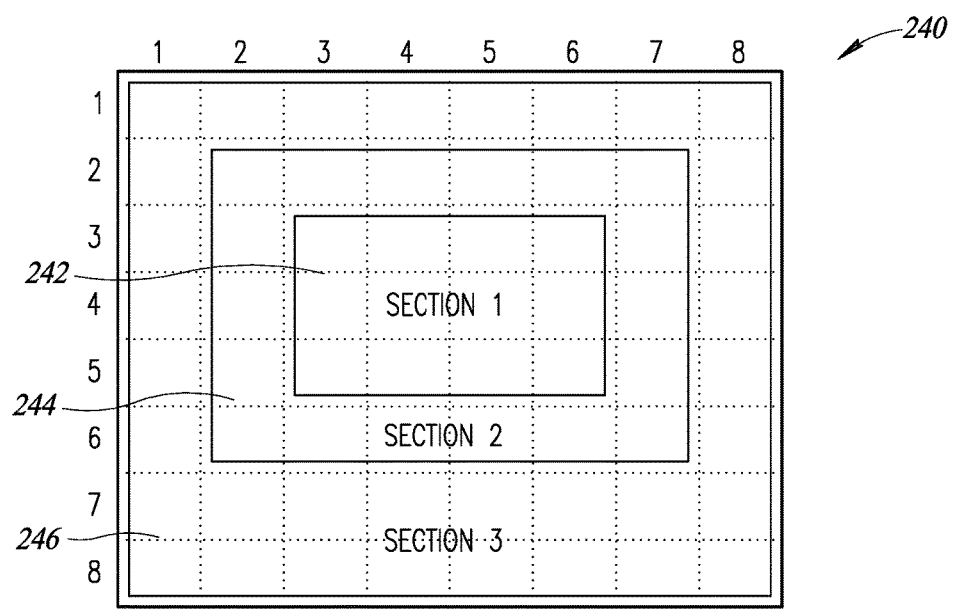
FIG. 14 is a diagram illustrating the application of another example spatial aware function to the first convolutional layer in a CNN.

A diagram illustrating the application of another example spatial aware function to the first convolutional layer in a CNN is shown in FIG. 14. In this example, the spatial aware function applied to the pixels of the input image 240 result in three sections, i.e. section 1 referenced 242, section 2 referenced 244, and section 3 referenced 246. In accordance with the spatial function, the pixels in section 1 are considered more important and receive more attention than the pixels in sections 2, and 3. A priority of importance is applied where section 1 is assigned the highest priority and descending to section 3 which is assigned the lowest priority.

Figure 15:
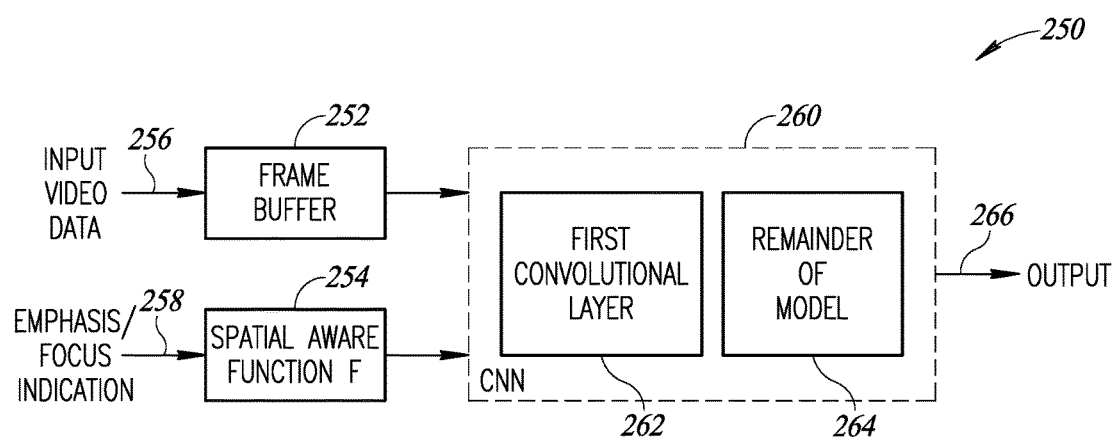
FIG. 15 is a block diagram illustrating an example application of a spatial aware function to the first convolutional layer in a CNN.

A block diagram illustrating an example application of a spatial aware function to the first convolutional layer in a CNN is shown in FIG. 15. The system, generally referenced 250, comprises a frame buffer 252 configured to receive input video data 256, a spatial aware function F 254, and a CNN 260 incorporating a first convolutional layer 262 and the remainder of the model 264. In contrast with the system shown in FIG. 5, the system in FIG. 15 also receives an external emphasis and focus indication 258. This indication is used to position the spatial aware function on the input image. Utilizing the external focus and emphasis indication, the system dynamically receives updates regarding the location of the spatial function. Consider, for example, a spiral shaped spatial function. The location in the image where the spiral starts can be dynamically controlled by the external focus indication received.

In an alternative embodiment, use of the mechanism of the present invention enables dilution of precision to be applied as a function of available energy or power in the system. When the system must conserve power, it performs less computationally intensive tasks to the important regions of the input image (i.e. regions of emphasis and focus) while neglecting altogether the less important or non-important regions of the input image. In general, the priority of tasks performed while in power conservation mode goes from high to low as the distance from the start of the spatial function increases.

In another alternative embodiment, use of the mechanism of the present invention already results in the input feature domain being sorted according to distance from the emphasis or focus. In addition to this, the system can divert attention to areas in the periphery (as opposed to areas of focus) by decaying the areas of emphasis and focus. This creates a 'negative' of the input image in that the sequence or order of rearrangement as dictated by the spatial aware function is 'reversed'. Thus, regions of high interest are now regions of low interest and vice versa. Note that this can be performed on an ad hoc basis to enable instantaneous detections at specific regions of the image with higher likelihood of detection.

In one embodiment, duty cycle of the time the system spends between on one or more main areas of emphasis and focus and areas of the periphery can be varied as desired. For example, the duty cycle can be set to 95% whereby 95% of the time the system extracts information from the on one or more main areas of emphasis and focus and for 5% of the time the system extracts information from the periphery.

In another embodiment, the mechanism of the present invention can be used to learn where the emphasis and focus should be in an image when it is unknown beforehand. Once the focus is obtained, it is used for processing subsequent input images. This is achieved by applying the spatial aware function F at different starting points in the image and analyzing the coherent detections. The starting point that yields a maximum detection result corresponds to an area of emphasis and focus and can be used in subsequent input images. Thus, regions of emphasis and focus are auto-detected and learned using the mechanism of the present invention.

Figure 16:
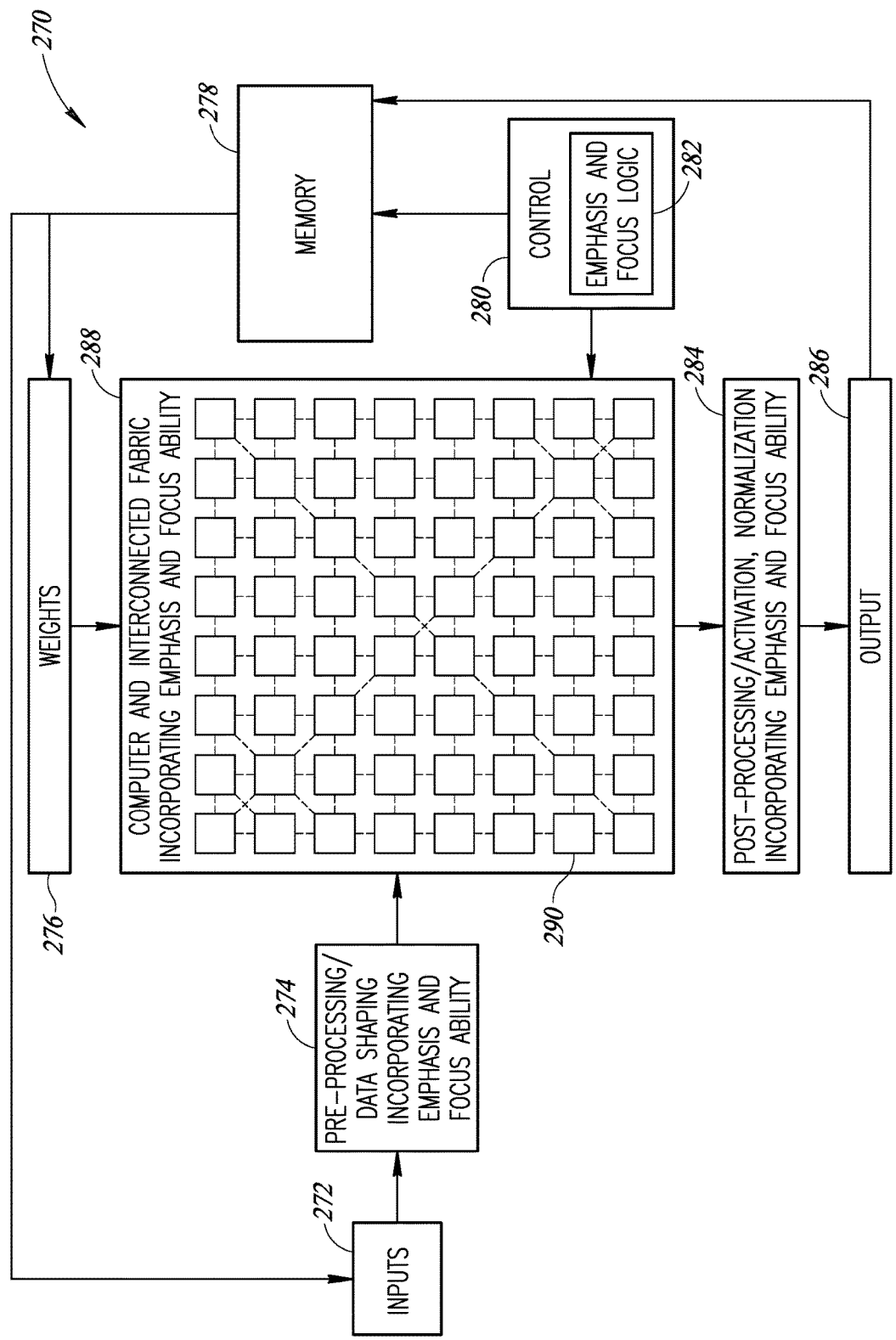
FIG. 16 is a block diagram illustrating an example integrated circuit device implementing an artificial neural network incorporating the emphasis and focus techniques of the present invention.

A block diagram illustrating an example integrated circuit device implementing an artificial neural network incorporating the emphasis and focus techniques of the present invention is shown in FIG. 16. The device, generally referenced 270, comprises a control block 280 incorporating logic circuitry 282 that implements the emphasis and focus mechanism of the present invention described in detail supra, memory block 278, inputs 272, pre-processing/data shaping block 274 incorporating emphasis and focus capability, weights block 276, computer and interconnected fabric 288 incorporating emphasis and focus capability, post-processing/activation, normalization block 284 incorporating emphasis and focus capability, and output block 286.

The device 270 describes a generalized version of a device that efficiently implements a neural network. It comprises an array of computational elements 288 (i.e. the fabric). Note that these elements are either physical or virtual entities that implement the mathematical computation required to obtain a desired output from the neural network.

The computational elements use two sets of data points, the inputs 272 and the weights 276 retrieved from memory

278. The inputs may be subject to pre-processing via block 274 and the outputs may be subject to post-processing via block 284.

A control entity 280 is operative to orchestrate the overall execution of the device by triggering data retrieval of inputs and weights from memory to the compute fabric 288, as well as triggering the execution of the compute fabric.

Note that in the context of the present invention, the components that are adapted to implement focus or emphasis functionality of the invention may or may not participate in execution of the device, depending on the actual implementation. In one embodiment, the compute fabric 288 supports one or more modes at the computation entity level that enable the device to measure its performance (i.e. to determine whether to perform the computation or not) based on the significance of the particular input. The significance of a particular input is provided as a trigger signal sent from the control entity 280 in accordance with a spatial aware function that provides input significance information.

In one embodiment, the pre 274 and post 284 processing units choose a different behavior that trades-off computational intensity for power, latency, etc. In another embodiment, the controller 280 access different regions of memory that load different weights, reflecting the level of importance provided by the importance-aware function (e.g., spatial aware function). As a non-limiting n example, a different set of weights may be applied according to the function.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of implementing a convolutional neural network (CNN), the method comprising:
  receiving a frame buffer of pixels representing an input image;
  convolving a first convolutional kernel with said frame buffer of pixels in accordance with a spatial aware function; and
  wherein said spatial aware function is adapted to emphasize and focus on one or more portions of said input image whereby portions of said image having higher spatial significance are convolved before portions having lower spatial significance.

2. The method according to claim 1, wherein said spatial aware function approximates at least one of a square spiral shape, rectangular spiral shape, circular spiral shape, elliptical spiral shape, and any arbitrary shape.

3. The method according to claim 1, further comprising dilution of precision at least one of before and after said convolving.

4. The method according to claim 3, wherein said dilution of precision comprises at least one of changing kernel size, changing kernel stride, changing kernel quantization, applying stronger pooling, applying weaker pooling, dropping one or more pixels before convolution, dropping one or more convolution results, increasing precision of number representations, and decreasing precision of number representations.

5. The method according to claim 3, wherein precision dilution is applied as a function of available energy in a system.

6. The method according to claim 1, further comprising emphasizing and focusing on peripheral portions of the input image by decaying portions of original emphasis and focus in the input image.

7. The method according to claim 1, wherein:
pixels in said frame buffer are reordered in accordance with said spatial aware function; and
said frame buffer is convolved in order of said reordered pixels.

8. The method according to claim 1, wherein:
pixels in said frame buffer remain in their original order; and
the pixels in said frame buffer are convolved in order according to said spatial aware function.

9. The method according to claim 1, wherein a plurality of emphasized portions of the input image are convolved in corresponding batches.

10. The method according to claim 1, further comprising:
receiving an external indication of one or more portions of emphasis and focus for the input image; and
generating said spatial aware function in accordance with said external indication.

11. The method according to claim 1, further comprising:
applying said spatial aware function at a plurality of different starting points in said input image;
for each said starting point, generating a coherent detection result; and
estimating an emphasis and focus point in said input image corresponding to a maximum coherent detection result.

12. A convolutional neural network (CNN) having emphasis and focus capability, comprising:
a frame buffer of pixels representing an input image;
a convolution circuit operative to convolve a first convolutional kernel with said frame buffer of pixels in accordance with a spatial aware function; and
wherein said spatial aware function is adapted to emphasize and focus on one or more portions of said input image whereby portions of said image having higher spatial significance are convolved before portions having lower spatial significance.

13. The apparatus according to claim 12, wherein said spatial aware function approximates at least one of a square spiral shape, rectangular spiral shape, circular spiral shape, elliptical spiral shape, and any arbitrary shape.

14. The apparatus according to claim 12, further comprising a precision dilution circuit operative to dilute precision at least one of before and after convolution of said input image.

15. The method according to claim 14, wherein said precision dilution circuit is operative to perform at least one of change kernel size, change kernel stride, change kernel quantization, apply stronger pooling, apply weaker pooling, drop one or more pixels before convolution, drop one or more convolution results, increase precision of number representations, and decrease precision of number representations.

16. The method according to claim 14, wherein precision dilution is applied as a function of available energy in a system.

17. The method according to claim 12, further comprising a circuit operative to emphasize and focus on peripheral portions of the input image by decaying portions of original emphasis and focus in the input image.

18. The apparatus according to claim 12, wherein:
pixels in said frame buffer are reordered in accordance with said spatial aware function; and
said frame buffer is convolved in order of said reordered pixels.

19. The method according to claim 12, wherein:
pixels in said frame buffer remain in their original order; and
the pixels in said frame buffer are convolved in order according to said spatial aware function.

* * * * *